US012805195B2

(12) United States Patent
Bong et al.

(10) Patent No.: US 12,805,195 B2
(45) Date of Patent: Nov. 17, 2026

(54) THERMOELECTRIC DEVICE AND THERMOELECTRIC SYSTEM COMPRISING SAME

(71) Applicant: LG INNOTEK CO., LTD., Seoul (KR)

(72) Inventors: Sang Hoon Bong, Seoul (KR); Hyung Min Sohn, Seoul (KR); Tae Su Yang, Seoul (KR); Boone Won, Seoul (KR); Seung Hwan Lee, Seoul (KR); Jong Min Lee, Seoul (KR); Hyung Eui Lee, Seoul (KR); Yong Sang Cho, Seoul (KR); Man Hue Choi, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 18/873,414

(22) PCT Filed: Jun. 21, 2023

(86) PCT No.: PCT/KR2023/008624

§ 371 (c)(1),
(2) Date: Dec. 10, 2024

(87) PCT Pub. No.: WO2023/249410

PCT Pub. Date: Dec. 28, 2023

(65) Prior Publication Data

US 2025/0204254 A1 Jun. 19, 2025

(30) Foreign Application Priority Data

Jun. 22, 2022 (KR) ........................ 10-2022-0075945
Jun. 22, 2022 (KR) ........................ 10-2022-0075946
(Continued)

(51) Int. Cl.
*H10N 10/17* (2023.01)
*H10N 10/13* (2023.01)
(Continued)

(52) U.S. Cl.
CPC ............. *H10N 10/17* (2023.02); *H10N 10/13* (2023.02); *H10N 10/80* (2023.02); *H10N 10/82* (2023.02)

(58) Field of Classification Search
None
See application file for complete search history.

(56) References Cited

U.S. PATENT DOCUMENTS

2012/0325280 A1* 12/2012 Akiyama ............... H10N 10/17
136/200

FOREIGN PATENT DOCUMENTS

JP 2009194299 A * 8/2009
KR 20190085705 A * 7/2019 ............. H01L 35/32
(Continued)

OTHER PUBLICATIONS

Machine translation of JP2009194299A (Year: 2009).*
(Continued)

*Primary Examiner* — Tamir Ayad
(74) *Attorney, Agent, or Firm* — KED & ASSOCIATES, LLP

(57) ABSTRACT

A thermoelectric array according to one embodiment of the present invention comprises: a first thermoelectric module; and a second thermoelectric module arranged to be adjacent to the first thermoelectric module, wherein: the first thermoelectric module includes a first lower substrate, a plurality of semiconductor devices arranged on the first lower substrate, and a first upper substrate arranged on the plurality of semiconductor elements; the second thermoelectric module includes a second lower substrate, a plurality of semiconductor elements arranged on the second lower substrate, and a second upper substrate arranged on the plurality of semiconductor elements; and the first thermoelectric module includes a first groove, and the second thermoelectric mod-
(Continued)

ule includes a second groove arranged at a position corresponding to the first groove.

14 Claims, 34 Drawing Sheets

(30) Foreign Application Priority Data

| | | |
|---|---|---|
| Sep. 8, 2022 | (KR) | 10-2022-0114291 |
| Sep. 8, 2022 | (KR) | 10-2022-0114292 |
| Sep. 8, 2022 | (KR) | 10-2022-0114293 |
| Sep. 8, 2022 | (KR) | 10-2022-0114297 |
| Sep. 8, 2022 | (KR) | 10-2022-0114298 |

(51) Int. Cl.

| | |
|---|---|
| ***H10N 10/80*** | (2023.01) |
| ***H10N 10/82*** | (2023.01) |

(56) References Cited

FOREIGN PATENT DOCUMENTS

| | | | | |
|---|---|---|---|---|
| KR | 10-2020-0007265 | | 1/2020 | |
| KR | 20200140015 A | * | 12/2020 | H10N 10/17 |
| KR | 20200144316 A | * | 12/2020 | H10N 10/851 |
| KR | 10-2021-0090997 | | 7/2021 | |
| KR | 10-2022-0037173 | | 3/2022 | |
| KR | 10-2022-0040128 | | 3/2022 | |
| KR | 10-2022-0040980 | | 3/2022 | |

OTHER PUBLICATIONS

Machine translation of KR20190085705A (Year: 2019).*
Machine translation of KR20200144316A (Year: 2020).*
Machine translation of KR20200140015A (Year: 2020).*
International Search Report dated Sep. 14, 2023 issued in Application No. PCT/KR2023/008624.

* cited by examiner

THERMOELECTRIC DEVICE AND THERMOELECTRIC SYSTEM COMPRISING SAME

CROSS-REFERENCE TO RELATED PATENT APPLICATIONS

This application is a U.S. National Stage Application under 35 U.S.C. § 371 of PCT Application No. PCT/KR2023/008624, filed Jun. 21, 2023, which claims priority to Korean Patent Application Nos. 10-2022-0075945, filed Jun. 22, 2022; 10-2022-0075946, filed Jun. 22, 2022; 10-2022-0114291, filed Sep. 8, 2022, 10-2022-0114292, filed Sep. 8, 2022; 10-2022-0114293, filed Sep. 8, 2022; 10-2022-0114297, filed Sep. 8, 2022 and 10-2022-0114298, filed Sep. 8, 2022, whose entire disclosures are hereby incorporated by reference.

TECHNICAL FIELD

The present invention relates to a thermoelectric device, and more specifically, to a thermoelectric device using a temperature difference between a low-temperature portion and a high-temperature portion of a thermoelectric element and a thermoelectric system including the same.

BACKGROUND ART

The thermoelectric effect is a phenomenon that occurs due to the movement of electrons and holes within a material, and refers to direct energy conversion between heat and electricity.

A thermoelectric element is a generic term for an element that uses the thermoelectric effect, and has a structure in which a PN junction pair is formed by bonding a P-type thermoelectric material and an N-type thermoelectric material between metal electrodes.

The thermoelectric element may be divided into an element that uses temperature changes in electrical resistance, an element that uses the Seebeck effect, which is a phenomenon in which the electromotive force is generated due to a temperature difference, and an element that uses the Peltier effect, which is a phenomenon in which heat is absorbed or generated by current, and the like.

The thermoelectric element is widely applied to home appliances, electronic components, communication components, and the like. For example, the thermoelectric element may be applied to cooling devices, heating devices, power generation devices, and the like. Accordingly, the demand for thermoelectric performance of thermoelectric elements is increasing.

In recent years, there is a need to generate electricity using high-temperature heat and thermoelectric elements in vehicles, ships, and the like. In this case, a fluid flow portion through which a first fluid passes may be disposed on a low-temperature portion side of the thermoelectric element, a heat sink may be disposed on a high-temperature portion side of the thermoelectric element, and a second fluid having a higher temperature than the first fluid may pass through the heat sink. Accordingly, electricity may be generated by a temperature difference between the low-temperature and high-temperature portions of the thermoelectric element.

DISCLOSURE

Technical Problem

The present invention is directed to providing a thermoelectric device using a temperature difference between a low-temperature portion and a high-temperature portion of a thermoelectric element and a thermoelectric system including the same.

Technical Solution

A thermoelectric module array according to one embodiment of the present invention includes a first thermoelectric module and a second thermoelectric module disposed adjacent to the first thermoelectric module, in which the first thermoelectric module includes a first lower substrate, a plurality of semiconductor elements disposed on the first lower substrate, and a first upper substrate disposed on the plurality of semiconductor elements, the second thermoelectric module includes a second lower substrate, a plurality of semiconductor elements disposed on the second lower substrate, and a second upper substrate disposed on the plurality of semiconductor elements, the first thermoelectric module includes a first groove, and the second thermoelectric module includes a second groove disposed at a position corresponding to the first groove.

The plurality of semiconductor elements disposed on the first lower substrate may include 1-1 semiconductor elements disposed in a first region of the first lower substrate and 1-2 semiconductor elements disposed in a second region of the first lower substrate, the plurality of semiconductor elements disposed on the second lower substrate may include 2-1 semiconductor elements disposed in a third region of the second lower substrate and 2-2 semiconductor elements disposed in a fourth region of the second lower substrate, the first upper substrate may include a 1-1 upper substrate disposed on the 1-1 semiconductor elements and the 1-2 upper substrate disposed on the 1-2 semiconductor elements, and the second upper substrate may include a 2-1 upper substrate disposed on the 2-1 semiconductor elements and a 2-2 upper substrate disposed on the 2-2 semiconductor elements.

The first groove may be formed on one side of the first lower substrate, and the second groove may be formed on one side of the second lower substrate.

The first groove and the second groove may be disposed at a position corresponding to a region between the 1-1 upper substrate and the 1-2 upper substrate.

The thermoelectric module array may include a frame disposed on the first lower substrate and the second lower substrate and disposed between the first upper substrate and the second upper substrate, and the frame may include holes corresponding to the first groove and the second groove.

The frame may be disposed between the 1-1 upper substrate and the 1-2 upper substrate and between the 2-1 upper substrate and the 2-2 upper substrate.

The thermoelectric module array may further include a connecting electrode connecting the first region and the second region, and the first groove and the second groove may be disposed at a position where the first groove and the second groove overlap each other along a direction perpendicular to a direction in which the connecting electrode extends.

The thermoelectric module array may further include a fastening member disposed in the first groove and the second groove, the first upper substrate may include a first cut portion, the second upper substrate may include a second cut portion, and the first cut portion and the second cut portion may be corner portions of the first upper substrate and the second upper substrate adjacent to the fastening member.

The frame may have a shape corresponding to the first cut portion and the second cut portion.

The thermoelectric module array may include a first insulating layer disposed between the first lower substrate and the plurality of semiconductor elements and a second insulating layer disposed between the plurality of semiconductor elements and the first upper substrate.

The thermoelectric module may further include a third insulating layer disposed between the first insulating layer and the plurality of semiconductor elements.

The thermoelectric module may further include an extension electrode extending to one side from the first electrode portion on the first lower substrate and an insulating member disposed on the extension electrode.

A ratio of a distance from an end of the first lower substrate to a closest semiconductor element among the plurality of semiconductor elements to a distance from the extension electrode to the end of the first lower substrate may be 1.5 or more and 3.5 or less.

A ratio of a height of the insulating member to the distance from the extension electrode to the end of the first lower substrate may be 0.25 or more and 0.7 or less.

A thermoelectric module array according to another embodiment of the present invention includes a first lower substrate, a plurality of semiconductor elements disposed on the first lower substrate, and a 1-1 upper substrate and a 1-2 upper substrate disposed on the plurality of semiconductor elements, in which the first lower substrate includes a 1-1 groove and a 1-2 groove, and an imaginary line connecting a center of the 1-1 groove and a center of the 1-2 groove is disposed in a region between the 1-1 upper substrate and the 1-2 upper substrate.

A thermoelectric module array according to still another embodiment of the present invention includes a first lower substrate, a plurality of first electrode portions disposed on the first lower substrate, a plurality of semiconductor elements disposed on the first electrode portions, a first upper substrate disposed on the plurality of semiconductor elements, an extension electrode extending to one side from the first electrode portions, and an insulating member disposed on the extension electrode, in which the insulating member includes a resin portion and an insulating frame having an opening formed to accommodate the resin portion, and the resin portion is disposed on the extension electrode.

A thermoelectric device according to one embodiment of the present invention includes a fluid flow portion including a first surface and a second surface spaced apart from the first surface along a first direction, a first thermoelectric module disposed on the first surface of the fluid flow portion, and a second thermoelectric module disposed on the second surface of the fluid flow portion, in which the fluid flow portion includes a flow path region including a flow path formed along a second direction perpendicular to the first direction, a fluid inflow region disposed on one side of the flow path region and including a first hole formed along the second direction, a fluid discharge region disposed on the other side of the flow path region and including a second hole formed along the second direction, and a first step portion disposed between the first hole and the flow path, and the first step portion includes a first step surface and a first chamfer surface extending from the first step surface to be inclined toward the flow path.

The first fluid may pass through the fluid inflow region, the flow path region, and the fluid discharge region along the second direction, and the second fluid having a higher temperature than the first fluid may pass through heat sinks of the first thermoelectric module and the second thermoelectric module in a third direction perpendicular to the first direction and the second direction.

The first step surface may be a surface parallel to a surface perpendicular to the second direction.

A height of the first step surface may be 1 mm or more from a wall surface of the first hole.

The first chamfer surface may be inclined at an angle of 5 degrees to 85 degrees with respect to a surface perpendicular to the first step surface.

A length of the first chamfer surface may be three times or more the height of the first step surface.

A cross-sectional area of the first hole may be larger than a cross-sectional area of the flow path.

The fluid flow portion may further include a second step portion disposed between the flow path and the second hole, and the second step portion may include a second step surface and a second chamfer surface extending from the second step surface to be inclined toward the flow path.

A thermoelectric device according to another embodiment of the present invention includes a fluid flow portion including a first surface and a second surface spaced apart from the first surface along a first direction, a first thermoelectric module disposed on the first surface of the fluid flow portion, and a second thermoelectric module disposed on the second surface of the fluid flow portion, in which the fluid flow portion includes a flow path region including a flow path formed along a second direction perpendicular to the first direction, a fluid inflow region disposed on one side of the flow path region and including a first hole formed along the second direction, and a fluid discharge region disposed on the other side of the flow path region and including a second hole formed along the second direction, and a first groove having a predetermined depth is formed in a wall surface of the first hole.

The first fluid may pass through the fluid inflow region, the flow path region, and the fluid discharge region along the second direction, and the second fluid having a higher temperature than the first fluid may pass through heat sinks of the first thermoelectric module and the second thermoelectric module in a third direction perpendicular to the first direction and the second direction.

The first groove may be formed in a continuous ring shape along the wall surface of the first hole.

The first groove may be formed in a discontinuous ring shape along the wall surface of the first hole.

A length of the first groove may be 20% or more of a circumferential length of the wall surface of the first hole.

The first groove may be formed in a spiral shape along the wall surface of the first hole.

The thermoelectric device may further include a step portion disposed between the first hole and the flow path.

The first groove may be formed to extend along the second direction from one side of the fluid inflow region to the step portion, which is the other side of the fluid inflow region.

A second groove spaced apart from the first groove and having a predetermined depth may be further formed in the wall surface of the first hole.

The first groove and the second groove may be sequentially disposed along the second direction from one side of the fluid inflow region to the other side of the fluid inflow region, and at least one of a distance from one side of the fluid inflow region to the first groove and a distance from the second groove to the step portion, which is the other side of the fluid inflow region, may be greater than or equal to a distance between the first groove and the second groove.

A thermoelectric device according to still another embodiment of the present invention includes a fluid flow portion including a first surface and a second surface spaced apart from the first surface in a first direction, a first thermoelectric module disposed on the first surface, a second thermoelectric module disposed on the second surface, a first shield member disposed on a third surface formed between the first surface and the second surface and extending to cover at least a portion of the first surface and the second surface, a second shield member disposed on the first surface and the first thermoelectric module and covering at least a portion of the first shield member, and a third shield member disposed on a fourth surface opposite to the third surface and extending to cover at least a portion of the second shield member.

The fluid flow portion may include a flow path region formed so that a first fluid flows along a second direction intersecting the first direction between the first surface and the second surface, the first thermoelectric module may include a first substrate disposed on the first surface, a first electrode portion disposed on the first substrate, a semiconductor element disposed on the first electrode portion, a second electrode portion disposed on the semiconductor element, a second substrate disposed on the second electrode portion, and a heat sink disposed on the second substrate to be in contact with a second fluid having a higher temperature than the first fluid, and the second fluid may flow along a third direction from the fourth surface toward the third surface.

The second shield member may include a through hole through which the heat sink is exposed, and an edge of the through hole may be disposed on the second substrate.

The first thermoelectric module may further include an extension electrode extending from the first electrode portion in a direction toward the fourth surface on the first substrate.

The first thermoelectric module may further include a wire connected to the extension electrode, and at least a portion of the wire may be covered by the third shield member.

The fluid flow portion may include a fluid inflow region disposed on one side of the flow path region and a fluid discharge region disposed on the other side of the flow path region spaced apart from the one side in the second direction, the first thermoelectric module and the second shield member may be disposed on the flow path region and further include a fifth shield member disposed on the fluid inflow region and a sixth shield member disposed on the fluid discharge region.

The fifth shield member and the sixth shield member may extend to cover a portion of the third surface and the fourth surface of the fluid flow portion, respectively, and the fifth shield member may include a groove formed in the fourth surface.

The wire may be drawn out through the groove.

The thermoelectric device may further include a first insulating member disposed between the third surface and the first shield member, and a second insulating member disposed between the fourth surface and the third shield member.

The thermoelectric device may further include a sealing member disposed between the second shield member and the third shield member.

The thermoelectric device may further include a fourth shield member disposed on the second surface of the fluid flow portion and the second thermoelectric module and extending to cover a portion of the first shield member of the third surface, and the third shield member may extend to further cover a portion of the fourth shield member of the second surface.

A thermoelectric system according to one embodiment of the present invention includes a first thermoelectric device, a second thermoelectric device spaced apart from the first thermoelectric device along a first direction, a wire portion electrically connected to the first thermoelectric device and the second thermoelectric device, and a wire protection portion disposed on one side of the first thermoelectric device and the second thermoelectric device to surround at least a portion of the wire portion, in which the wire protection portion includes a bottom portion disposed on the first thermoelectric device and the second thermoelectric device, a first side wall extending from a first end of the bottom portion toward an upward direction of the bottom portion, a second side wall extending from a second end spaced apart from the first end of the bottom portion along the first direction toward the upward direction with respect to the bottom portion, a third side wall disposed between the first side wall and the second side wall and extending from a third end between the first end and the second end of the bottom portion toward the upward direction, a fourth side wall disposed between the first side wall and the second side wall and extending from a fourth end spaced apart from the third end of the bottom portion in the first direction and a second direction intersecting the upward direction toward the upward direction, a first top portion spaced apart from the bottom portion and extending from the third side wall toward the second direction, a second top portion spaced apart from the bottom portion and extending from the fourth side wall in a direction opposite to the second direction, and a fifth side wall extending from the second top portion toward the upward direction and connected to the first top portion, and a distance between the third side wall and the fifth side wall gradually decreases along the upward direction.

A height of the first top portion based on the bottom portion may be higher than a height of the second top portion based on the bottom portion.

An angle formed by the third side wall and the fifth side wall may be 10 to 70 degrees.

A distance between the third side wall and the fourth side wall may gradually decrease along the upward direction.

The wire protection portion may further include a shield cover portion disposed between the first side wall and the second side wall and covering at least a portion of the first top portion, the second top portion, and the fifth side wall.

At least one fastening hole may be formed in each of the first top portion and the second top portion, and the wire protection portion may be fastened to the shield cover portion through the at least one fastening hole.

The wire protection portion may further include a first insulating member disposed between the bottom portion and the first top portion and a second insulating member disposed between the bottom portion and the second top portion.

The thermoelectric system may further include an upper structure disposed on the other side of the first thermoelectric device and the second thermoelectric device.

Shapes of the wire protection portion and the upper structure may be symmetrical to each other.

The thermoelectric system may further include a first hole and a second hole formed to be spaced apart along the first direction in the bottom portion and a third hole formed in the third side wall, a first wire connected to the first thermoelectric device may pass through the first hole and be drawn out to the outside through the third hole, and a second wire connected to the second thermoelectric device may pass through the second hole and be drawn out to the outside through the third hole.

A thermoelectric system according to another embodiment of the present invention includes a first thermoelectric system and a second thermoelectric system disposed below the first thermoelectric system, in which the first thermoelectric system includes a first thermoelectric device, a second thermoelectric device disposed to be spaced apart from the first thermoelectric device along a first direction, a first wire portion electrically connected to the first thermoelectric device and the second thermoelectric device, and a first wire protection portion disposed on one side of the first thermoelectric device and the second thermoelectric device to surround at least a portion of the first wire portion, the second thermoelectric system includes a third thermoelectric device, a fourth thermoelectric device disposed to be spaced apart from the third thermoelectric device along the first direction, a second wire portion electrically connected to the third thermoelectric device and the fourth thermoelectric device, and a second wire protection portion disposed on the upper side of the third thermoelectric device and the fourth thermoelectric device to surround at least a portion of the second wire portion, each of the first to fourth thermoelectric devices includes a flow path region formed so that a first fluid pass therethrough along a second direction perpendicular to the first direction, a second fluid having a higher temperature than the first fluid flows along a third direction perpendicular to the first direction and the second direction between the first thermoelectric device and the second thermoelectric device that are spaced apart and between the third thermoelectric device and the fourth thermoelectric device that are spaced apart, and a width of a bottom portion of the second wire protection portion is 0.98 to 1.02 times a width of a top portion of the second wire protection portion.

The thermoelectric system may further include a first upper structure symmetrically disposed with respect to the first wire protection portion on the other side of the first thermoelectric device and the second thermoelectric device, and a second upper structure symmetrically disposed with respect to the second wire protection portion at an upper part on the other side of the third thermoelectric device and the fourth thermoelectric device, and an interval between facing surfaces of the first wire protection portion and the first upper structure may gradually narrow along a direction in which the second fluid flows, and a shortest distance between the bottom portion of the second wire protection portion and a bottom portion of the second upper structure may be 0.96 to 1.04 times a shortest distance between the top portion of the second wire protection portion and a top portion of the second upper structure.

The first wire protection portion may include a first bottom portion disposed on the first thermoelectric device and the second thermoelectric device, a first side wall extending from a first end of the first bottom portion toward an upward direction with respect to the first bottom portion, a second side wall extending from a second end spaced apart from the first end of the first bottom portion along the first direction toward the upward direction with respect to the first bottom portion, a third side wall disposed between the first side wall and the second side wall and extending from a third end between the first end and the second end of the first bottom portion toward the upward direction, a fourth side wall disposed between the first side wall and the second side wall and extending from a fourth end spaced apart from the third end of the first bottom portion in the second direction toward the upward direction, a first top portion spaced apart from the first bottom portion and extending from the third side wall toward the second direction, a second top portion spaced apart from the first bottom portion and extending from the fourth side wall in a direction opposite to the second direction, and a fifth side wall extending from the second top portion toward the upward direction and connected to the first top portion, and a distance between the third side wall and the fifth side wall may gradually decrease along the upward direction.

The second wire protection portion may include a second bottom portion disposed on the third thermoelectric device and the fourth thermoelectric device, a sixth side wall extending from a fifth end of the second bottom portion in an upward direction with respect to the second bottom portion, a seventh side wall extending from a sixth end spaced apart from the fifth end of the second bottom portion along the first direction toward the upward direction with respect to the second bottom portion, an eighth side wall disposed between the sixth side wall and the seventh side wall and extending from a seventh end between the fifth end and the sixth end of the second bottom portion toward the upward direction, a ninth side wall disposed between the sixth side wall and the seventh side wall and extending from an eighth end spaced apart from the seventh end of the second bottom portion in the second direction toward the upward direction, and a third top portion spaced apart from the second bottom portion and extending from the eighth side wall toward the second direction, the ninth side wall may extend to the third top portion, and the eighth side wall and the ninth side wall may be parallel to each other.

Advantageous Effects

According to an embodiment of the present invention, a thermoelectric device that has a simple structure, is easily assembled, and accommodates a maximum number of thermoelectric elements within a predetermined space can be obtained.

According to an embodiment of the present invention, a thermoelectric device having high thermoelectric performance can be obtained by increasing a temperature difference between a high-temperature portion and a low-temperature portion.

A thermoelectric device according to an embodiment of the present invention can be applied to a power generation device that generates electricity by using a temperature difference between a high-temperature portion and a low-temperature portion.

A thermoelectric device according to an embodiment of the present invention can be applied to a Peltier device that cools or heats a specific object such as a fluid.

MODES OF THE INVENTION

Hereinafter, preferred embodiments of the present invention will be described in detail with reference to the accompanying drawings.

However, the technical idea of the present invention is not limited to some embodiments to be described but may be implemented in various different forms, and within the scope of the technical idea of the present invention, one or more among components in the embodiments may be used by being selectively combined and substituted.

Further, unless specifically defined and described, terms used in the embodiments of the present invention (including technical and scientific terms) may be interpreted as meanings which are generally understood by those skilled in the art to which the present invention pertains, and commonly used terms such as terms defined in the dictionary may be interpreted in consideration of the contextual meaning of the related art.

The terms used in the embodiments of the present invention are for the purpose of describing the embodiments only and are not intended to limit the invention.

In the present specification, the singular forms may include the plural forms unless the context clearly dictates otherwise, and when described as "at least one (or one or more) among A, B, and (or) C," it may include one or more of all possible combinations of A, B, and C.

In addition, in describing a component of embodiments of the present invention, terms such as first, second, A, B, (a), (b), etc. may be used.

These terms are only for distinguishing the component from other components, and the essence, sequence, or order of the component is not limited by the terms.

In addition, when a component is described as being "linked," "coupled," or "connected" to another component, the component is not only directly linked, coupled, or connected to another component, but also "linked," "coupled," or "connected" to another component with still another component disposed between the component and the other component.

Further, when a component is described as being formed or disposed "on (above) or under (below)" of another component, the term "on (above) or under (below)" includes not only when two components are in direct contact with each other, but also when one or more of other components are formed or disposed between the two components. Further, when a component is described as being "on (above) or below (under)," the description may include the meanings of an upward direction and a downward direction based on one component.

Figure 1:
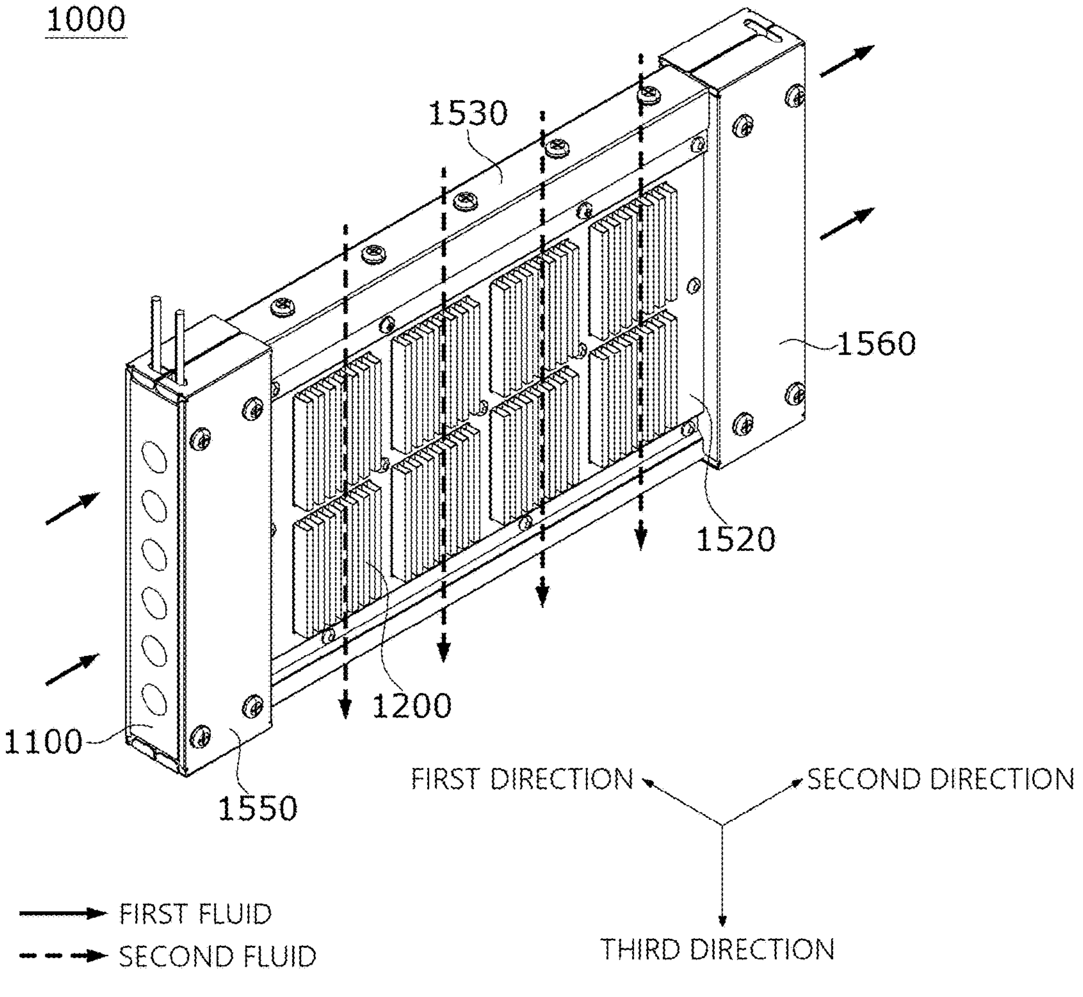
FIG. 1 is a perspective view of a thermoelectric device according to one embodiment of the present invention.
Figure 2:
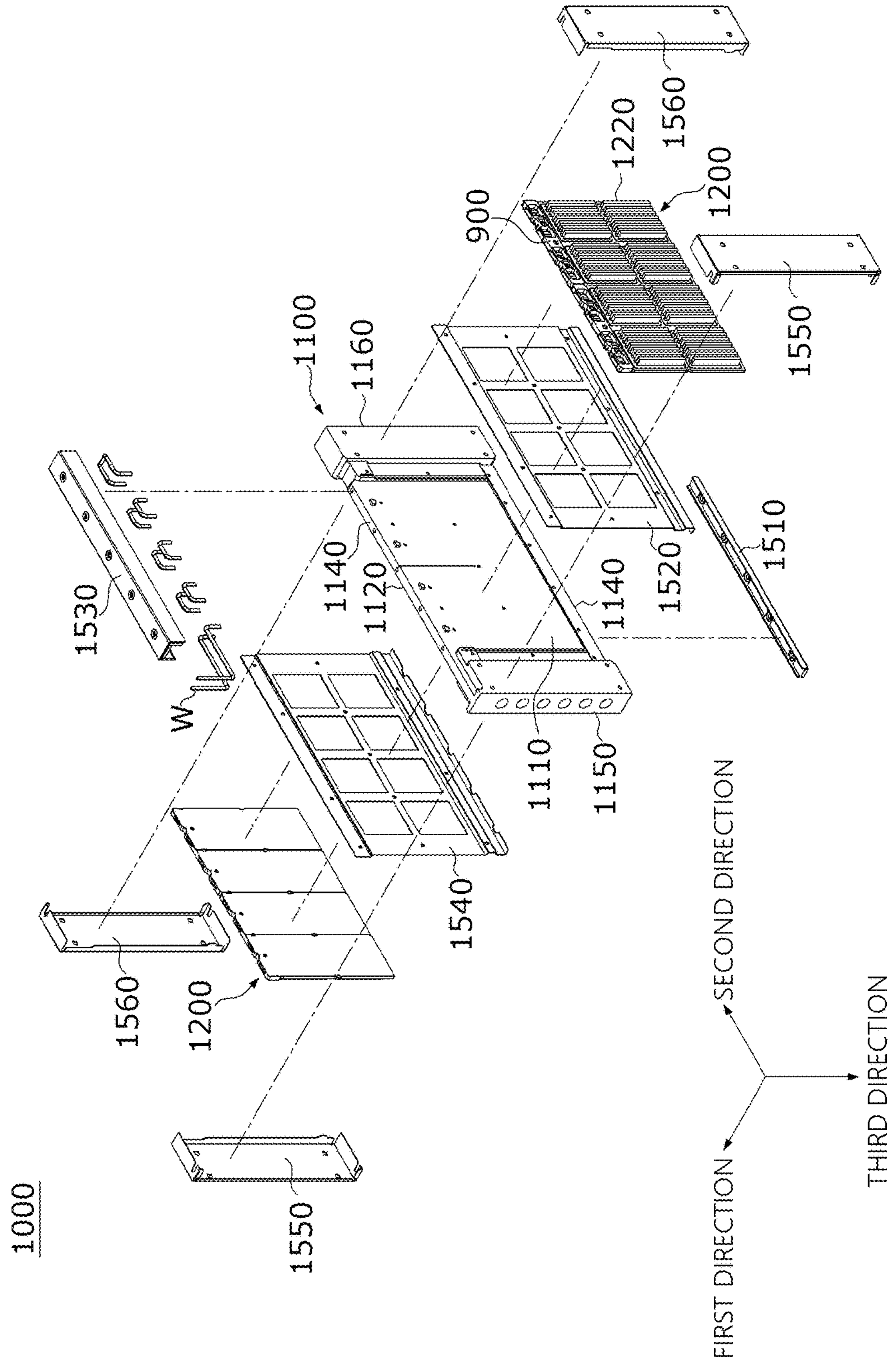
FIG. 2 is an exploded perspective view of the thermoelectric device according to one embodiment of the present invention.

FIG. 1 is a perspective view of a thermoelectric device according to one embodiment of the present invention, and FIG. 2 is an exploded perspective view of the thermoelectric device according to one embodiment of the present invention.

Referring to FIGS. 1 and 2, a thermoelectric device 1000 includes a fluid flow portion 1100 and a thermoelectric module 1200 disposed on a surface of the fluid flow portion 1100.

The thermoelectric device 1000 according to the embodiment of the present invention may generate electric power using a temperature difference between a first fluid flowing through the interior of the fluid flow portion 1100 and a second fluid passing through the exterior of the fluid flow portion 1100. A plurality of thermoelectric devices 1000 may be disposed in parallel to be spaced apart at a predetermined interval to form a thermoelectric system. Accordingly, the thermoelectric performance or power generation performance per unit area may be maximized. The thermoelectric device may be referred to as a power generation device, and the thermoelectric system may be referred to as a power generation system.

The first fluid flowing into the fluid flow portion 1100 may be water, but is not limited thereto, and may be any one of various types of fluids having cooling performance. The temperature of the first fluid flowing into the fluid flow portion 1100 may be less than 100° C., preferably less than 50° C., and more preferably less than 40° C., but is not limited thereto, and may be a fluid having a lower temperature than the second fluid. The temperature of the first fluid discharged after passing through the fluid flow portion 1100 may be higher than the temperature of the first fluid flowing into the fluid flow portion 1100.

According to the embodiment of the present invention, the thermoelectric module 1200 may be disposed on a first surface 1110 of the fluid flow portion 1100 and a second surface 1120 opposite to the first surface 1110. A first fluid may flow from one side surface 1150 between the first surface 1110 and the second surface 1120 toward the other side surface 1160 opposite to the one side surface 1150 between the first surface 1110 and the second surface 1120. To this end, a fluid inlet may be disposed on the one side surface and a fluid outlet may be disposed on the other side surface. The second fluid may flow from a fourth surface 1140, which is an upper surface between the first surface 1110 and the second surface 1120, toward a third surface 1130, which is a lower surface between the first surface 1110 and the second surface 1120. For convenience of description, in the present specification, a direction from the first surface 1110 to the second surface 1120 may be referred to as a first direction, a direction in which the first fluid passes may be referred to as a second direction, and a direction in which the second fluid passes may be referred to as a third direction, but the directions are not limited thereto.

Meanwhile, the second fluid passes through, the outside of the fluid flow portion 1100, for example, a heat sink of the thermoelectric module 1200 disposed outside the fluid flow portion 1100. The second fluid may be exhaust heat or intake heat of a vehicle, ship, or the like, but is not limited thereto. For example, the temperature of the second fluid may be 100° C. or higher, preferably 200° C. or higher, more preferably 220° C. to 250° C., but is not limited thereto, and may be a fluid having a temperature higher than the first fluid.

In the present specification, it is described as an example that the temperature of the first fluid flowing through the interior of the fluid flow portion 1100 is lower than the temperature of the second fluid passing through a heat sink 1220 of the thermoelectric module 1200 disposed outside the fluid flow portion 1100. Accordingly, in the present specification, the fluid flow portion 1100 may be referred to as a duct or a cooling portion. However, the embodiment of the present invention is not limited thereto, and the temperature of the first fluid flowing through the interior of the fluid flow portion 1100 may be higher than the temperature of the second fluid passing through the heat sink 1220 of the thermoelectric module 1200 disposed outside the fluid flow portion 1100.

According to the embodiment of the present invention, the thermoelectric module 1200 includes a thermoelectric element and the heat sink 1220 disposed on the thermoelectric element. The thermoelectric element according to the embodiment of the present invention may have a structure of a thermoelectric element 100 as exemplified in FIGS. 3 to 4.

Figure 3:
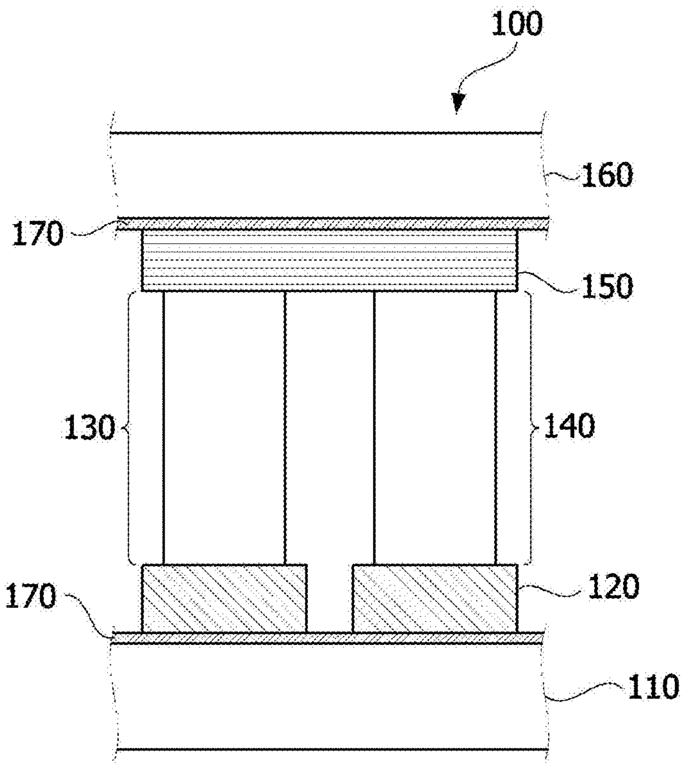
FIGS. 3 and 4 show a thermoelectric element according to one embodiment of the present invention.
Figure 4:
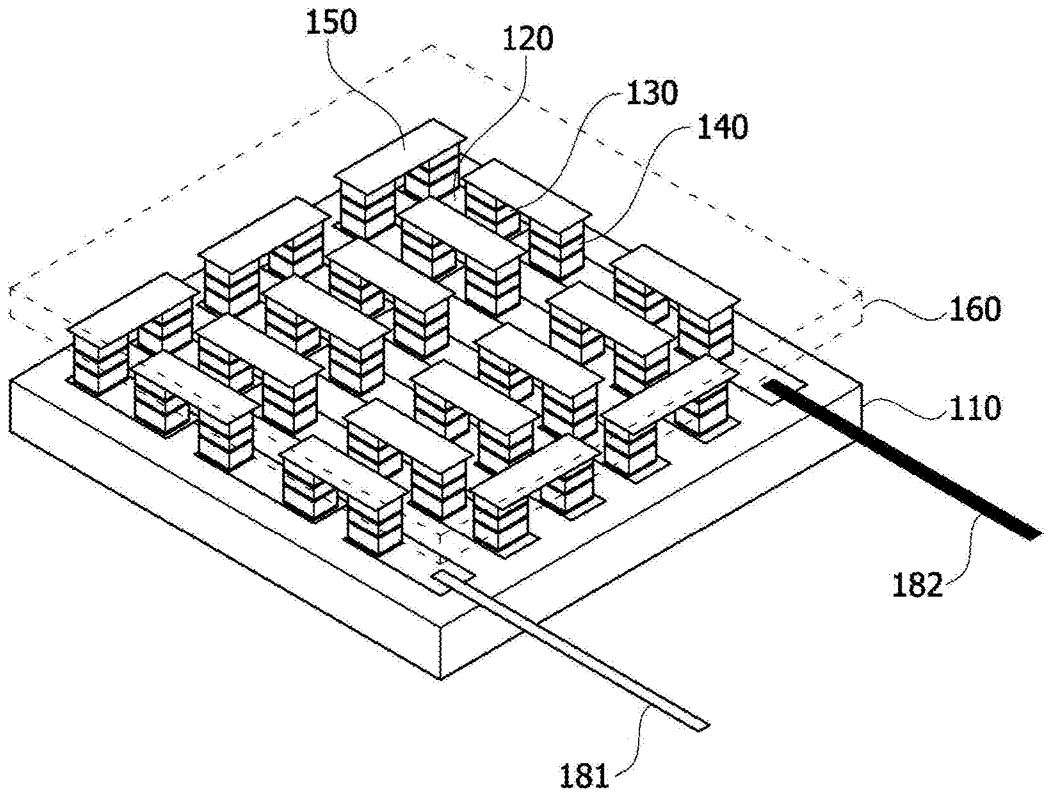

Referring to FIGS. 3 and 4, the thermoelectric element 100 includes a first substrate 110, a first electrode portion 120, a P-type semiconductor element 130, an N-type semiconductor element 140, a second electrode portion 150, and a second substrate 160.

The first electrode portion 120 is disposed between the first substrate 110 and lower bottom surfaces of the P-type semiconductor element 130 and the N-type semiconductor element 140, and the second electrode portion 150 is disposed between the second substrate 160 and upper bottom surfaces of the P-type semiconductor element 130 and the N-type semiconductor element 140. Accordingly, a plurality of P-type semiconductor elements 130 and a plurality of N-type semiconductor elements 140 are electrically connected by the first electrode portion 120 and the second electrode portion 150. A pair of the P-type semiconductor element 130 and the N-type semiconductor element 140 that are disposed between the first electrode portion 120 and the second electrode portion 150 and electrically connected may form a unit cell.

For example, when a voltage is applied to the first electrode portion 120 and the second electrode portion 150 through lead wires 181 and 182, a substrate through which current flows from the P-type semiconductor element 130 to the N-type semiconductor element 140 due to the Peltier effect may absorb heat to act as a cooling portion, and a substrate through which current flows from the N-type semiconductor element 140 to the P-type semiconductor element 130 may be heated to act as a heating portion. Alternatively, when a temperature difference is applied between the first electrode portion 120 and the second electrode portion 150, electric charges within the P-type semiconductor element 130 and the N-type semiconductor element 140 may move due to the Seebeck effect, and electricity may be generated.

Here, the P-type semiconductor element 130 and the N-type semiconductor element 140 may be bismuth telluride (Bi—Te)-based semiconductor elements containing bismuth (Bi) and tellurium (Te) as main raw materials. The P-type semiconductor element 130 may be a bismuth telluride (Bi—Te)-based thermoelectric leg including at least one of antimony (Sb), nickel (Ni), aluminum (Al), copper (Cu), silver (Ag), lead (Pb), boron (B), gallium (Ga), tellurium (Te), bismuth (Bi), and indium (In). For example, with respect to 100 wt % of the total weight, the P-type semiconductor element 130 may contain 99 to 99.999 wt % of Bi—Sb—Te as a main raw material and may contain 0.001 to 1 wt % of at least one of nickel (Ni), aluminum (Al), copper (Cu), silver (Ag), lead (Pb), boron (B), gallium (Ga), and indium (In). The N-type semiconductor element 140 may be a bismuth telluride (Bi—Te)-based thermoelectric leg including at least one of selenium (Se), nickel (Ni), aluminum (Al), copper (Cu), silver (Ag), lead (Pb), boron (B), gallium (Ga), tellurium (Te), bismuth (Bi), and indium (In). For example, with respect to 100 wt % of the total weight, the N-type semiconductor element 140 may contain 99 to 99.999 wt % of Bi—Se—Te as a main raw material and may contain 0.001 to 1 wt % of at least one of nickel (Ni), aluminum (Al), copper (Cu), silver (Ag), lead (Pb), boron (B), gallium (Ga), and indium (In).

The P-type semiconductor element 130 and the N-type semiconductor element 140 may be formed in a bulk or stacked form. In general, the bulk P-type semiconductor element 130 or the bulk N-type semiconductor element 140 may be obtained through a process of manufacturing an ingot by heat-treating a thermoelectric material, obtaining a powder for a thermoelectric leg by crushing and sieving the ingot, sintering the powder, and then cutting a sintered body. In this case, the P-type semiconductor element 130 and the N-type semiconductor element 140 may be polycrystalline thermoelectric legs. As described above, when the P-type semiconductor element 130 and the N-type semiconductor element 140 are polycrystalline thermoelectric legs, the strength of the P-type semiconductor element 130 and the N-type semiconductor element 140 may be increased. The stacked P-type semiconductor element 130 or stacked N-type semiconductor element 140 may be obtained through a process of forming a unit member by applying a paste containing a thermoelectric material on a sheet-shaped substrate, and then stacking and cutting the unit members.

In this case, a pair of the P-type semiconductor element 130 and the N-type semiconductor element 140 may have the same shape and volume, or may have different shapes and volumes. For example, since electrical conduction characteristics of the P-type semiconductor element 130 and the N-type semiconductor element 140 are different, a height or cross-sectional area of the N-type semiconductor element 140 may be formed differently from a height or cross-sectional area of the P-type semiconductor element 130.

In this case, the P-type semiconductor element 130 or N-type semiconductor element 140 may have a cylindrical shape, a polygonal column shape, an elliptical column shape, or the like.

In the present specification, the semiconductor element may also be referred to as a thermoelectric leg, a thermoelectric structure, a semiconductor structure, or the like.

The performance of the thermoelectric element according to one embodiment of the present invention may be expressed by the figure of merit (ZT). The figure of merit (ZT) may be expressed as Equation 1.

$$ZT = \alpha^2 \cdot \sigma \cdot T / k \quad \text{[Equation 1]}$$

Here, a is a Seebeck coefficient [V/K], $\sigma$ is an electrical conductivity [S/m], and $\alpha^2\sigma$ is a power factor [W/mk$^2$]. Furthermore, T is a temperature, k is a thermal conductivity [W/mK]. k may be expressed as $a \cdot cp \cdot \rho$, where a is a thermal diffusivity [cm$^2$/S], cp is a specific heat [J/gK], and $\rho$ is a density [g/cm$^3$].

In order to obtain the figure of merit of the thermoelectric element, a Z value (V/K) is measured using a Z meter, and the figure of merit (ZT) may be calculated using the measured Z value.

Here, the first electrode portion 120 disposed between the first substrate 110 and the P-type semiconductor element 130 and the N-type semiconductor element 140, and the second electrode portion 150 disposed between the second substrate 160 and the P-type semiconductor element 130 and the N-type semiconductor element 140 may include at least one of copper (Cu), silver (Ag), aluminum (Al), and nickel (Ni), and may have a thickness of 0.01 mm to 0.3 mm. When the thickness of the first electrode portion 120 or the second electrode portion 150 is less than 0.01 mm, the function as an electrode may be deteriorated and the electrical conductivity performance may be lowered, and when the thickness exceeds 0.3 mm, the conduction efficiency may be lowered due to an increase in resistance.

Further, the first substrate 110 and the second substrate 160 opposite each other may be metal substrates, and their thickness may be 0.1 mm to 1.5 mm. When the thickness of the metal substrate is less than 0.1 mm or more than 1.5 mm, since the heat dissipation characteristics or thermal conductivity may become excessively high, the reliability of the thermoelectric element may be deteriorated. In addition, when the first substrate 110 and the second substrate 160 are metal substrates, insulating layers 170 may be further formed between the first substrate 110 and the first electrode portion 120 and between the second substrate 160 and the second electrode portion 150. The insulating layer 170 may include a material having a thermal conductivity of 1 to 20 W/mK. In this case, the insulating layer 170 may be a resin composition including at least one of an epoxy resin and a silicone resin and an inorganic material, a layer formed of a silicone composite including silicone and an inorganic material, or an aluminum oxide layer. Here, the inorganic material may be at least one of an oxide, nitride and carbide of aluminum, boron, silicon, or the like.

Each insulating layer 170 may be one insulating layer or a plurality of insulating layers of different compositions. At least a portion of a side surface of at least one of the first electrode portion 120 and the second electrode portion 150 may be embedded in the insulating layer 170, and an upper surface of the insulating layer 170 disposed between a plurality of electrodes included in each electrode portion may have a concave shape toward each substrate. When each insulating layer 170 is a plurality of insulating layers, at least a portion of the side surface of at least one of the first electrode portion 120 and the second electrode portion 150 may be embedded in the insulating layer 170 disposed at an uppermost portion based on each substrate, and an uppermost surface of the insulating layer 170 disposed between the plurality of electrodes included in each electrode portion may have a concave shape toward each substrate.

In this case, sizes of the first substrate 110 and the second substrate 160 may be differently formed. That is, the volume, thickness, or area of one of the first substrate 110 and the second substrate 160 may be formed to be greater than the volume, thickness, or area of the other. Here, the thickness may be a thickness in a direction from the first substrate 110 to the second substrate 160, and the area may be an area with respect to a direction perpendicular to the direction from the first substrate 110 to the second substrate 160. Accordingly, the heat absorption or heat dissipation performance of the thermoelectric element may be enhanced. Preferably, the volume, thickness, or area of the first substrate 110 may be formed to be larger than at least one of the volume, thickness, or area of the second substrate 160. In this case, at least one of the volume, the thickness, or the area of the first substrate 110 may be greater than the second substrate 160 when the first substrate 110 is disposed in a high-temperature region for the Seebeck effect, when the first substrate 110 is applied as a heating region for the Peltier effect, or when a sealing member for protecting the thermoelectric element from the external environment is disposed on the first substrate 110. In this case, the area of the first substrate 110 may be formed in a range of 1.2 to 5 times the area of the second substrate 160. When the area of the first substrate 110 is formed to be less than 1.2 times the area of the second substrate 160, the effect on improving the heat transfer efficiency is not significant, and when the area exceeds 5 times, the heat transfer efficiency is significantly reduced and thus it may be difficult to maintain the basic shape of the thermoelectric module.

In addition, a heat dissipation pattern, for example, a concavo-convex pattern, may be formed on a surface of at least one of the first substrate 110 and the second substrate 160. Accordingly, the heat dissipation performance of the thermoelectric element may be enhanced. When the concavo-convex pattern is formed on a surface that comes into contact with the P-type semiconductor element 130 or the N-type semiconductor element 140, the bonding characteristics between the semiconductor element and the substrate may also be improved.

Although not shown, a sealing member may be additionally disposed between the first substrate 110 and the second substrate 160. The sealing member may be disposed on side surfaces of the first electrode portion 120, the P-type semiconductor element 130, the N-type semiconductor element 140, and the second electrode portion 150 between the first substrate 110 and the second substrate 160. Accordingly, the first electrode portion 120, the P-type semiconductor element 130, the N-type semiconductor element 140, and the second electrode portion 150 may be sealed from external moisture, heat, contamination, and the like.

Referring back to FIGS. 1 and 2, the thermoelectric module 1200 may be disposed on each of the first surface 1110 and the second surface 1120 of the fluid flow portion 1100.

As described above, each thermoelectric element includes the first substrate 110 disposed to contact the fluid flow portion 1100, the first electrode portion 120 disposed on the first substrate 110, the plurality of semiconductor elements 130 and 140 disposed on the first electrode portion 120, the second electrode portion 150 disposed on the plurality of semiconductor elements 130 and 140, and the second substrate 160 disposed on the second electrode portion 150, and the heat sink 1220 is disposed on the second substrate 160. In this case, the first substrate of the thermoelectric element disposed on the fluid flow portion 1100 may be a metal substrate, and the metal substrate may be bonded to the surface of the fluid flow portion 1100 by a thermal interface material (TIM) (not shown). Since the metal substrate has excellent heat transfer performance, heat transfer between the thermoelectric element and the fluid flow portion 1100 is easy. In addition, when the metal substrate and the fluid flow portion 1100 are bonded by the thermal interface material (TIM), heat transfer between the metal substrate and the fluid flow portion 1100 may not be hindered. Here, the metal substrate may be one of a copper substrate, an aluminum substrate, and a copper-aluminum substrate, but is not limited thereto.

The thermoelectric module 1200 may include a connector for extracting the produced electricity to the outside or for applying electricity for use as a Peltier element. According to the embodiment of the present invention, an insulating member 900 may be disposed around a connector to uniformly maintain a bonding force between a thermoelectric module 1200 and a fluid flow portion 1100 and protect a wire W connected to the connector.

Furthermore, according to the embodiment of the present invention, a shield member 1500 may be further disposed to prevent moisture or contaminants from penetrating into the thermoelectric module 1200.

Figure 5:
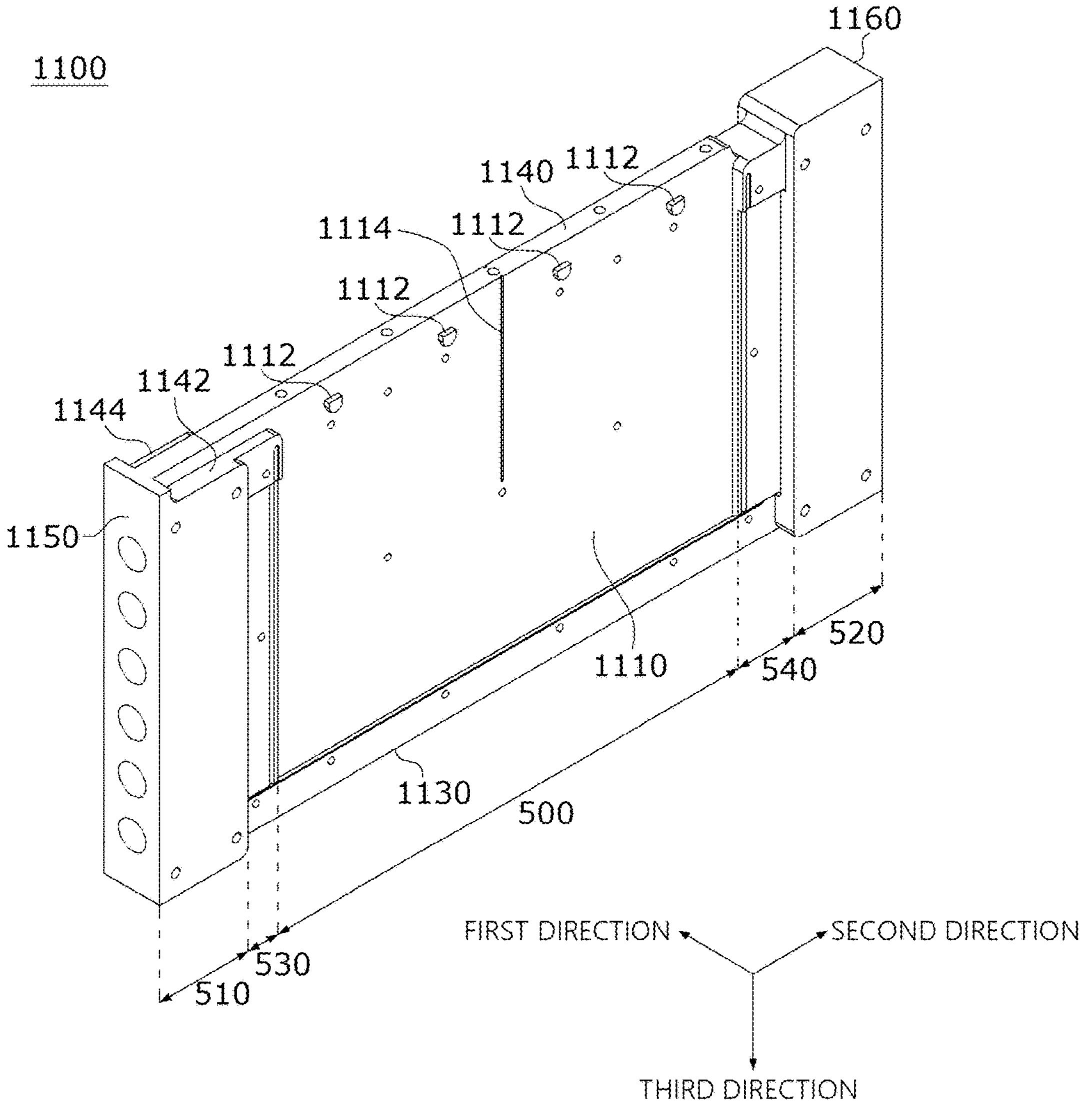
FIG. 5 is a perspective view of a fluid flow portion included in a thermoelectric device according to one embodiment of the present invention.
Figure 6:
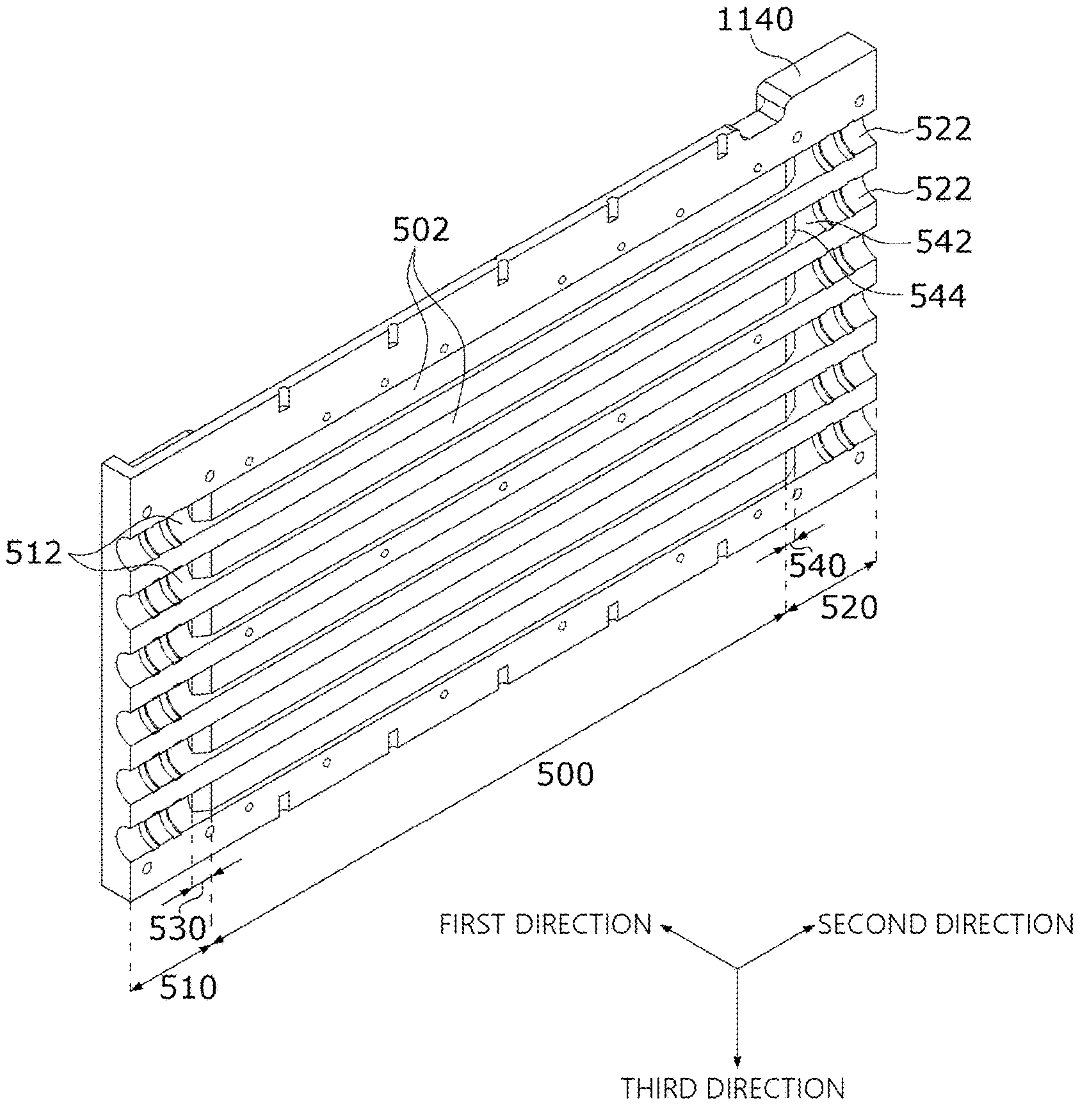
FIG. 6 is a cross-sectional view of the fluid flow portion according to one embodiment of the present invention.
Figure 7:
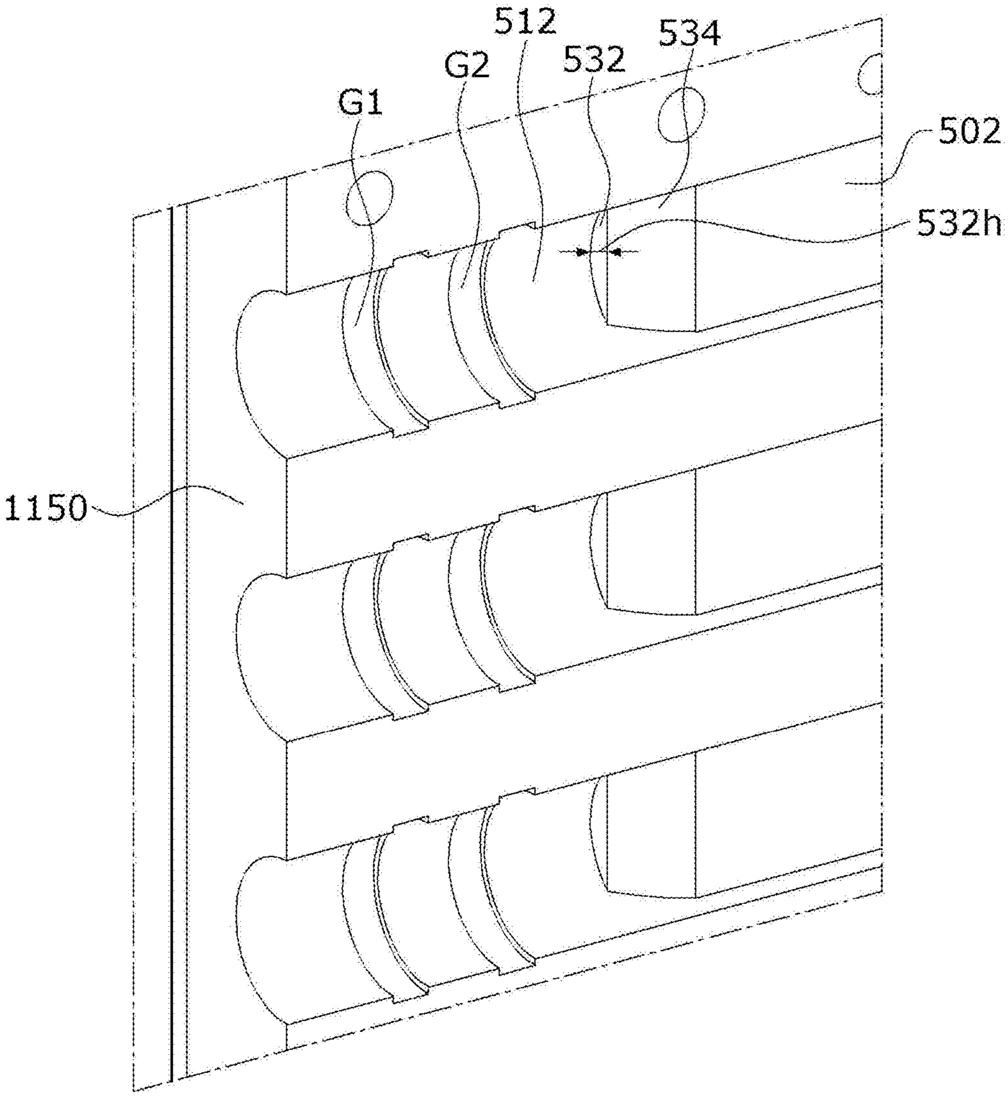
FIGS. 7 and 8 are enlarged views of portions of a cross-section of the fluid flow portion according to one embodiment of the present invention.
Figure 8:
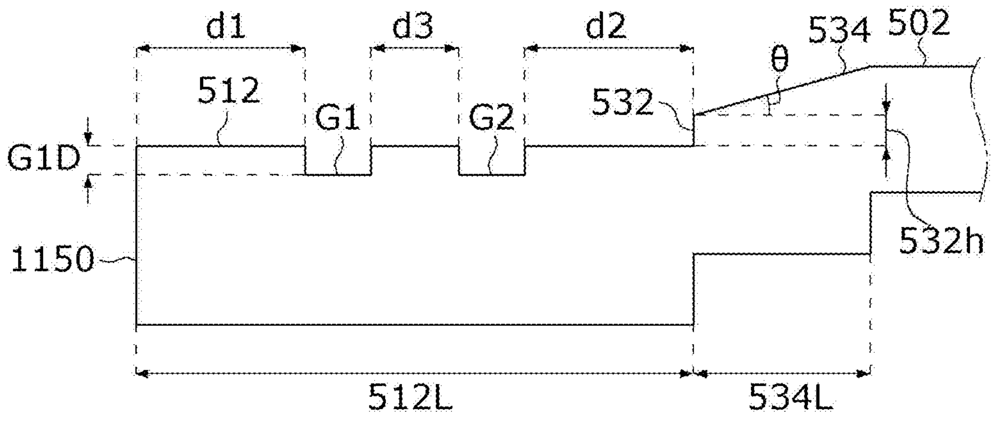

FIG. 5 is a perspective view of a fluid flow portion included in a thermoelectric device according to one embodiment of the present invention, FIG. 6 is a cross-sectional view of the fluid flow portion according to one embodiment of the present invention, and FIGS. 7 and 8 are enlarged views of portions of a cross-section of the fluid flow portion according to one embodiment of the present invention.

Referring to FIGS. 5 to 8, a fluid flow portion 1100 includes a flow path region 500 including a flow path 502 formed along a second direction perpendicular to a first direction from a first surface 1110 of the fluid flow portion 1100 toward a second surface 1120, a fluid inflow region 510 disposed on one side of the flow path region 500 and including a first hole 512 formed along the second direction, and a fluid discharge region 520 disposed on the other side of the flow path region 500 and including a second hole 522 formed along the second direction. Here, the flow path region 500 may include a plurality of flow paths 502 that are parallel along the second direction, the fluid inflow region 510 may include plurality of first holes 512 that are parallel along the second direction, the fluid discharge region 520 may include a plurality of second holes 522 that are parallel along the second direction, and each flow path 502 may be disposed to correspond to its respective first hole 512 and the second hole 522. A first fluid flowing into the first hole 512 may pass through the flow path 502 along the second direction and then be discharged into the second hole 522. To this end, a connecting member (not shown) may be disposed in the first hole 512, and the fluid flow portion 1100 may be connected to the outside through the connecting member. The connecting member may be in the shape of a hollow tube, and a portion thereof may be fitted into the first hole 512, and a remaining portion may protrude outside one side surface 1150 of the fluid flow portion 1100. The first fluid may be supplied from the outside through the connecting member, and may be delivered to the flow path 502 after passing through the connecting member fitted in the first hole 512. Similarly, the connecting member (not shown) is disposed in the second hole 522, and the fluid flow portion 1100 may be connected to the outside through the connecting member. The connecting member may be in the shape of a hollow tube, a portion thereof may be fitted into the second hole 522, and a remaining portion may protrude outside the other side surface 1160 of the fluid flow portion 1100. The first fluid may pass through the flow path 502 and then be discharged to the outside through the connecting member fitted into the second hole 522. The connecting member may also be referred to as a connecting pipe. In this way, when the thermoelectric device according to the embodiment of the present invention is connected to an external component through the connecting member, the use of fastening members such as screws may be minimized.

According to the embodiment of the present invention, a cross-sectional area of each first hole 512 may be larger than a cross-sectional area of each flow path 502. Here, the cross-sectional area may be defined as an area of a cross-section perpendicular to the second direction in which the first fluid flows. Accordingly, the cross-sectional area of the connecting member and the cross-sectional area of the flow path 502 in a state where the connecting member is fitted into the first hole 512 may be 0.8 to 1.2 times, 0.85 to 1.15 times, 0.9 to 1.1 times, 0.95 to 1.05 times, 0.97 to 1.03 times, or 0.99 to 1.01 times, and flow path resistance of the first fluid flowing along the second direction may be minimized.

Here, the first hole 512 and the flow path 502 are shown as being matched one to one, and the flow path 502 and the second hole 522 are shown as being matched one to one, but the embodiment is not limited thereto. According to another embodiment of the present invention, the fluid passing through the plurality of first holes 512 may be collected in one flow path, or the fluid passing through one flow path may be distributed to the plurality of second holes 522.

According to the embodiment of the present invention, the fluid flow portion 1100 further includes a first step portion 530 disposed between the first hole 512 and the flow path 502. According to the embodiment of the present invention, the first step portion 530 includes a first step surface 532 and a first chamfer surface 534 extending from the first step surface 532 to be inclined toward the flow path 502. Here, the first step surface 532 may be a surface parallel to a surface perpendicular to the second direction in which the first fluid flows. That is, the first step surface 532 may be a surface protruding from a wall surface of the first hole 512. The first step surface 532 may come into contact with an end of the connecting member (not shown) fitted into the first hole 512, and accordingly, may function as a stopper for the connecting member. Accordingly, when the connecting member is assembled with a fluid flow portion 1100 according to the embodiment of the present invention, the connecting member stops without being further inserted into the interior of the fluid flow portion 1100 when the end of the connecting member comes into contact with the first step surface 532, so that assembly may be easy and the bonding force between the connecting member and the fluid flow portion 1100 may be increased.

In this case, a height 532*h* of the first step surface 532 may be 1 mm or more from the wall surface of the first hole 512. The height 532*h* of the first step surface 532 may be less than or equal to the thickness of the hollow tubular connecting member, for example, 0.5 to 1 times the thickness of the connecting member. Accordingly, the flow of the first fluid may not be hindered by the first step surface 532 while the first step surface 532 maintains the function of the stopper of the connecting member. Accordingly, the eddy phenomenon of the first fluid by the first step surface 532 may be prevented.

According to the embodiment of the present invention, the first chamfer surface 534 is a surface that obliquely extends from the first step surface 532 toward the flow path 502, and the first fluid discharged from the connecting member fitted into the first hole 512 may flow into the flow path 502 without flow path resistance by the first chamfer surface 534. The first chamfer surface 534 may form an angle (θ) of 5 to 85 degrees, 10 to 80 degrees, 15 to 75 degrees, 20 to 70 degrees, 25 to 65 degrees, 30 to 60 degrees, 35 to 55 degrees, 40 to 50 degrees, 40 to 85 degrees, 45 to 85 degrees, 50 to 85 degrees, 55 to 85 degrees, 60 to 85 degrees, 65 to 85 degrees, 70 to 85 degrees, or 75 to 85 degrees, with respect to a surface perpendicular to the first step surface 532. Accordingly, the first fluid discharged from the connecting member may flow into the flow path 502 without any change in flow rate.

In this case, a length 534L of the first chamfer surface 534 may be three times or more the height 532*h* of the first step surface 532. The length 534L of the first chamfer surface 534 may be 60% or more of the inner diameter of the connecting member. Accordingly, the first fluid may flow into the flow path 502 without flow path resistance by the first chamfer surface 534, and the thickness of the fluid flow portion 1100 in the flow path region 500 in the first direction may be implemented to be thinner.

Similarly, the fluid flow portion 1100 further includes a second step portion 540 disposed between the flow path 502 and the second hole 522. Here, the embodiment is described focusing on the first step portion 530, but the same structure may also be applied to the second step portion 540. The first step portion 530 and the second step portion 540 may be symmetrical to each other. That is, the first step portion 540 may include a second step surface 542 disposed between the second hole 522 and the flow path 502 and a second chamfer surface 544 extending from the second step surface 542 to be inclined toward the flow path 502. Accordingly, the change in the flow rate of the first fluid may be prevented in the fluid discharge region 520, and the first fluid may be discharged to the outside without flow path resistance.

Meanwhile, as described above, the thermoelectric device 1000 according to the embodiment of the present invention is connected to an external component through the connecting member (not shown). One end of the connecting member is connected to an external component, and the other end of the connecting member is connected to the fluid flow portion 1100 according to the embodiment of the present invention. The other end of the connecting member may be inserted into the first hole 512 of the fluid flow portion 1100 according to the embodiment of the present invention and then fixed to the first hole 512.

To this end, according to the embodiment of the present invention, a first groove G1 having a predetermined depth is formed in the wall surface of the first hole 512. After inserting the other end of the connecting member into the first hole 512, when a diameter of the first hole is expanded by applying force to an inner wall of the connecting member at a position corresponding to the first groove G1 to expand the diameter, the other end of the connecting member may be pressed into the first hole 512. Accordingly, a gap between the connecting member and the first groove G1 of the first hole 512 disappears, thereby securing airtightness. Accordingly, since the thermoelectric device 1000 according to the embodiment of the present invention may be connected to an external component through the connecting member without a fastening member such as a screw, fastening strength and durability may be guaranteed.

In this case, the first hole 512 may be designed to have a circular shape like the connecting member, and the diameter of the first hole 512 may be designed to be larger than the diameter of the connecting member. For example, the diameter of the first hole 512 may be designed to be 0.2 to 0.4 mm larger than the diameter of the connecting member. Accordingly, the connecting member may be easily inserted into the first hole 512, and airtightness and fastening between the connecting member and the first hole 512 may be enhanced. To this end, the connecting member may be made of a flexible material and may be bent to fit the shape of the first hole 512 after being inserted into the first hole 512.

According to the embodiment of the present invention, a distance 512L from one side of the fluid inflow region 510 to the first step portion 530, which is the other side of the fluid inflow region 510, that is, a distance that the first hole 512 extends along the second direction, may be designed to be 40% or more and 70% or less of the total length of the connecting member. Accordingly, the fastening strength between the connecting member and the first hole 512 may be secured, and the fastening work may be easy.

According to the embodiment of the present invention, the first groove G1 formed in the first hole 512 may be formed in a continuous ring shape along the wall surface of the first hole 512. Accordingly, fixing between the connecting member and the first groove G1 may be easy.

Alternatively, according to the embodiment of the present invention, the first groove G1 formed in the first hole 512 may be formed in a discontinuous ring shape along the wall surface of the first hole 512.

Alternatively, according to the embodiment of the present invention, a length of the first groove G1 may be 20% or more, 30% or more, 40% or more, 50% or more, 60% or more, 70% or more, 80% or more, or 90% or more of a circumferential length of the wall surface of the first hole 512. Here, the length of the first groove G1 may be the extended distance of the first groove G1 along the wall surface of the first hole 512. For example, the length of the first groove G1 may be 1.5 mm to 4 mm. Accordingly, both the fastening strength and airtightness between the first groove G1 and the connecting member may be guaranteed.

According to the embodiment of the present invention, the first groove G1 may be formed in a spiral shape along the wall surface of the first hole 512. Accordingly, even when the thermoelectric device 1000 according to the embodiment of the present invention is subject to frequent vibration, the possibility that the connecting member is detached from the thermoelectric device 1000 may be minimized.

Alternatively, according to the embodiment of the present invention, the first groove G1 may be formed to extend along the second direction from one side of the fluid inflow region 510, that is, a fluid inlet, to the other side of the fluid inflow region 510, that is, the first step portion 530.

According to the embodiment of the present invention, a depth G1D of the first groove G1 may be 20% or more and 50% or less of the thickness of the connecting member. Here, the depth G1D of the first groove G1 may be a vertical distance from the wall surface of the first hole 512 to a bottom surface of the first groove G1. When the depth of the first groove G1 satisfies the numerical range, the fastening strength and airtightness with the connecting member may be simultaneously guaranteed.

In this case, the length of the first groove G1 may be greater than the depth G1D of the first groove G1. For example, the length of the first groove G1 may be 2 times or more, 5 times or more, 10 times or more, or 2 to 20 times the depth G1D of the first groove G1. Accordingly, the work for fixing the connecting member to the first hole 512 may be easy, and airtightness between the connecting member and the first hole 512 may be maintained.

According to the embodiment of the present invention, a second groove G2 having a predetermined depth and spaced apart from the first groove G1 may be further formed in the wall surface of the first hole 512. When two or more grooves are formed in the first hole 512, the fastening strength may be further increased in a hook-like shape while the connecting member fills the space of the first groove G1 and the second groove G2.

In this case, the first groove G1 and the second groove G2 may be sequentially disposed along the second direction from one side of the fluid inflow region 510, that is, the fluid inlet, to the other side of the fluid inflow region 510, that is, the first step portion 530, and at least one of a distance d1 from one side of the fluid inflow region 510 to the first groove G1 and a distance d2 from the second groove G2 to the first step portion 530, which is the other side of the fluid inflow region 510, may be greater than or equal to a distance d3 between the first groove G1 and the second groove G2. In this case, the distance between the first groove G1 and the second groove G2 may be 6 mm or more. Accordingly, the fastening strength and airtightness between the connecting member and the first hole 512 may be simultaneously guaranteed.

For convenience of description, the embodiment is described focusing on the groove formed in the first hole 512 of the fluid inflow region 510, but is not limited thereto. A groove having the same or similar structure as the first hole 512 may also be formed in the second hole 522 of the fluid discharge region 520.

Although not shown, a protrusion may be formed on an outer wall of the connecting member to engage with the groove of the first hole 512.

According to the embodiment of the present invention, the thickness of the fluid flow portion 1100 in the first direction may be different in the flow path region 500, the fluid inflow region 510, and the fluid discharge region 520. According to the embodiment of the present invention, the thickness of the fluid flow portion 1100 in the first direction may be different in the flow path region 500, the fluid inflow region 510, the fluid discharge region 520, the first step portion 530, and the second step portion 540. For example, the thickness in the first direction in the flow path region 500 may be thinner than the thickness in the first direction in the fluid inflow region 510 and the fluid discharge region 520. For example, the thickness in the first direction in the flow path region 500 may be thinner than the thickness in the first direction in the first step portion 530 and the second step portion 540, and may be thinner than the thickness in the first direction in the first step portion 530 and the second step portion 540. The thickness in the first direction in the flow path region 500 may be thinner than the thickness in the first direction in the fluid inflow region 510 and the fluid discharge region 520. When the first step portion 530 and the second step portion 540 include the first chamfer surface 534 and the second chamfer surface 544, respectively, the thickness of the flow path region 500 in the first direction may be implemented to be thinner than the thickness in the first direction in the fluid inflow region 510 and the fluid discharge region 520. Since thermoelectric modules are disposed on both sides of the flow path region 500, the number of thermoelectric devices accommodated per unit volume may be increased as the thickness of the flow path region 500 is implemented to be thinner and the thermoelectric performance per unit volume may be improved.

According to the embodiment of the present invention, step surfaces 1142 and 1144 may be formed in the fluid inflow region 510 of the fluid flow portion 1100 or the fourth surface 1140 of the fluid inflow region 510 and the first step portion 530. The step surfaces 1142 and 1144 may be parallel to the fourth surface 1140, but may form a step with the fourth surface 1140 with the fourth surface 1140 interposed therebetween. The step surface 1142 may serve to guide a wire connected to the thermoelectric module 1200 disposed on the first surface 1110 and the second surface 1120 of the fluid flow portion 1100.

According to the embodiment of the present invention, protrusions 1112 may be disposed on the first surface 1110 and the second surface 1120 of the flow path region 500 of the fluid flow portion 1100. The protrusions 1112 may be a plurality of protrusions spaced apart from each other at predetermined intervals along the second direction on the side closer to the fourth surface 1140 among the third surface 1130 and the fourth surface 1140 of the fluid flow portion 1100. The protrusions 1112 may be a position-fixer of the thermoelectric module 1200 or the shield member 1500 to be described below.

According to the embodiment of the present invention, predetermined grooves 1114 may be formed in the first surface 1110 and the second surface 1120 of the flow path region 500 of the fluid flow portion 1100. The predetermined grooves 1114 may be a position guide for the thermoelectric module 1200 to be described below.

According to the embodiment of the present invention, the thermoelectric module 1200 is disposed on the first surface 1110 and the second surface 1120 of the fluid flow portion 1100. The fluid flow portion 1100 includes the flow path region 500, and the flow path inflow region 510 and the flow path discharge region 520 disposed on both sides of the flow path region 500. According to the embodiment of the present invention, a thermoelectric module 1200 is disposed in the flow path region 500.

Figure 9:
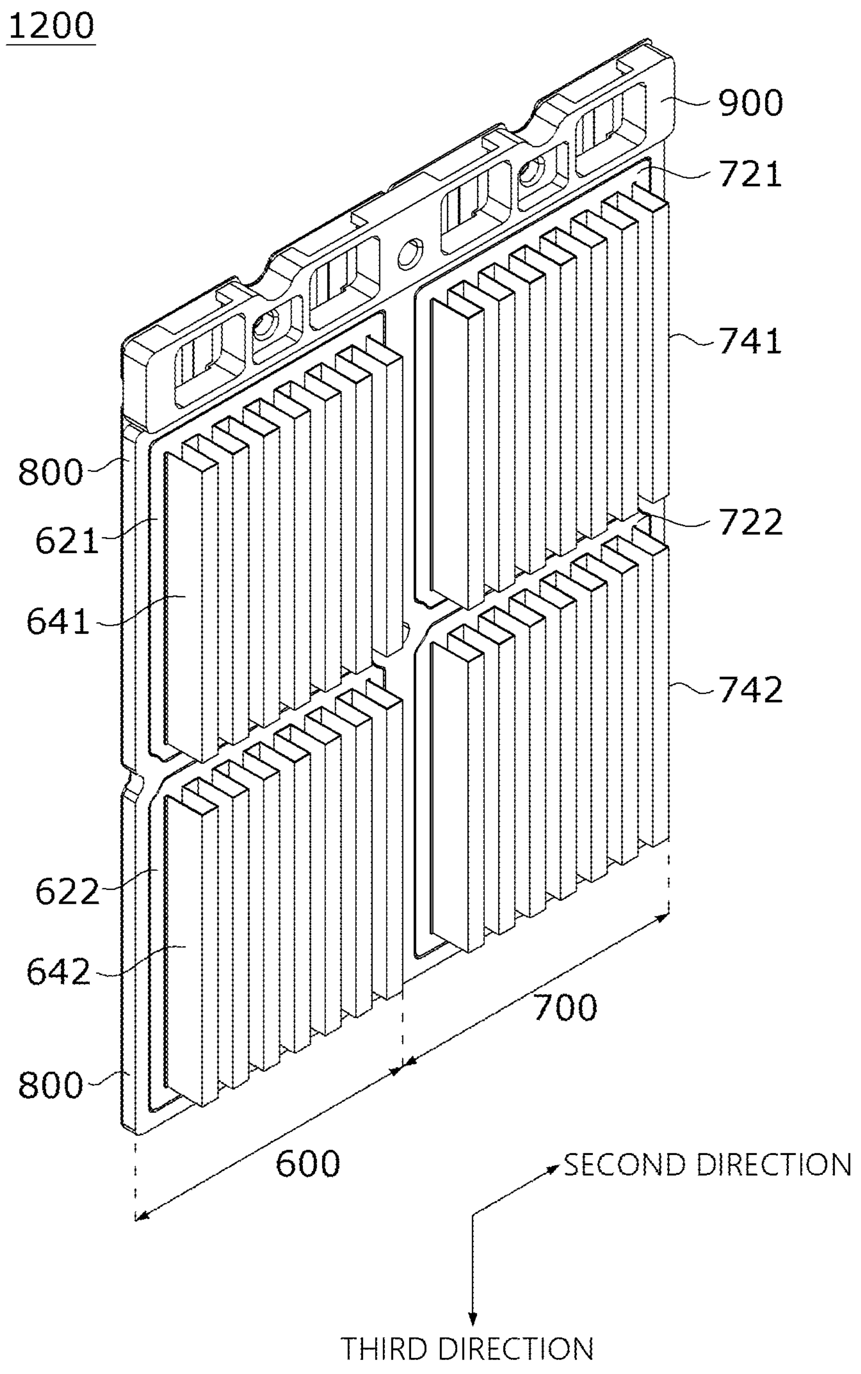
FIG. 9 is a perspective view of a thermoelectric module according to one embodiment of the present invention.
Figure 10:
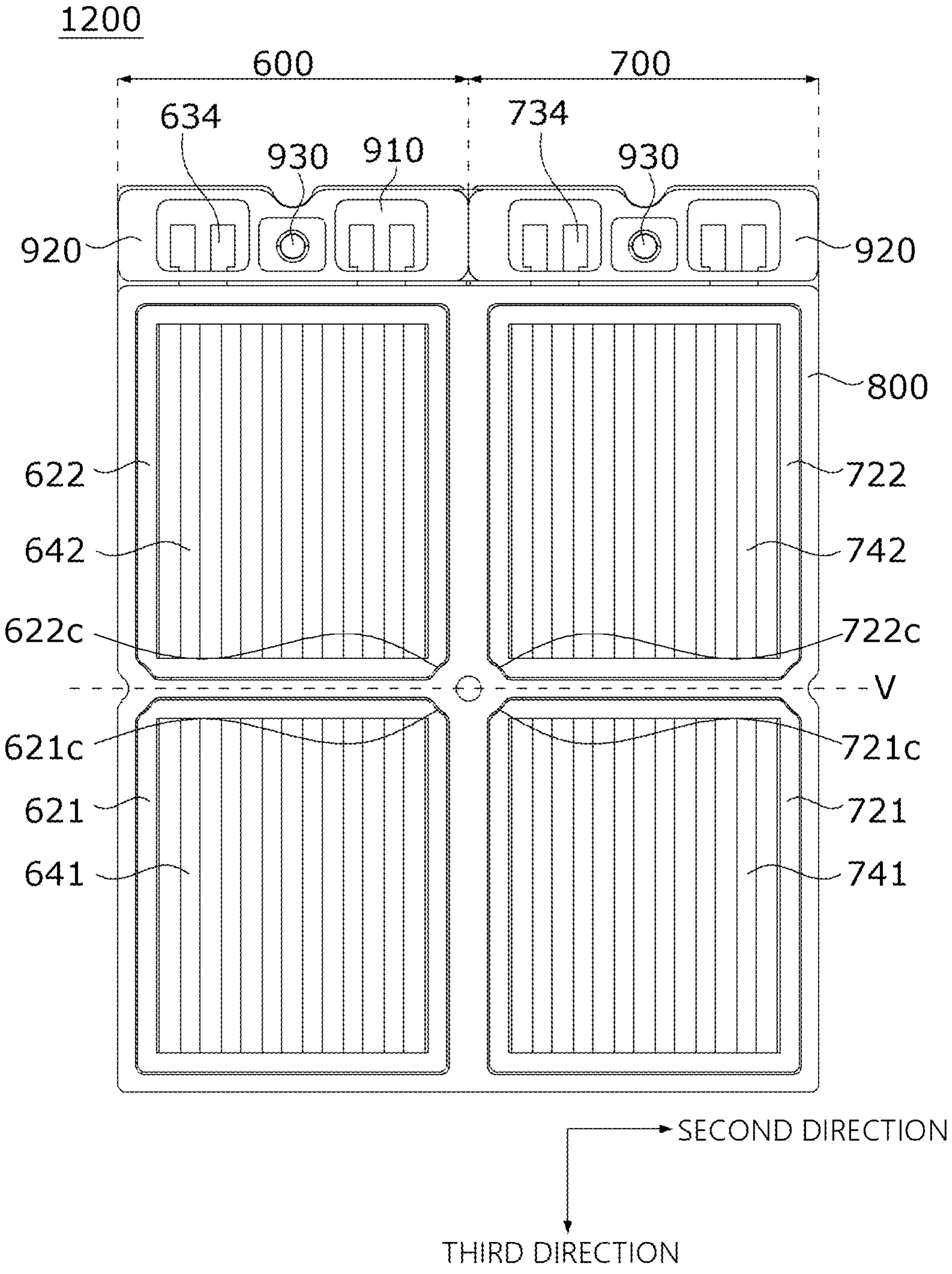
FIG. 10 is a plan view of the thermoelectric module according to one embodiment of the present invention.
Figure 11:
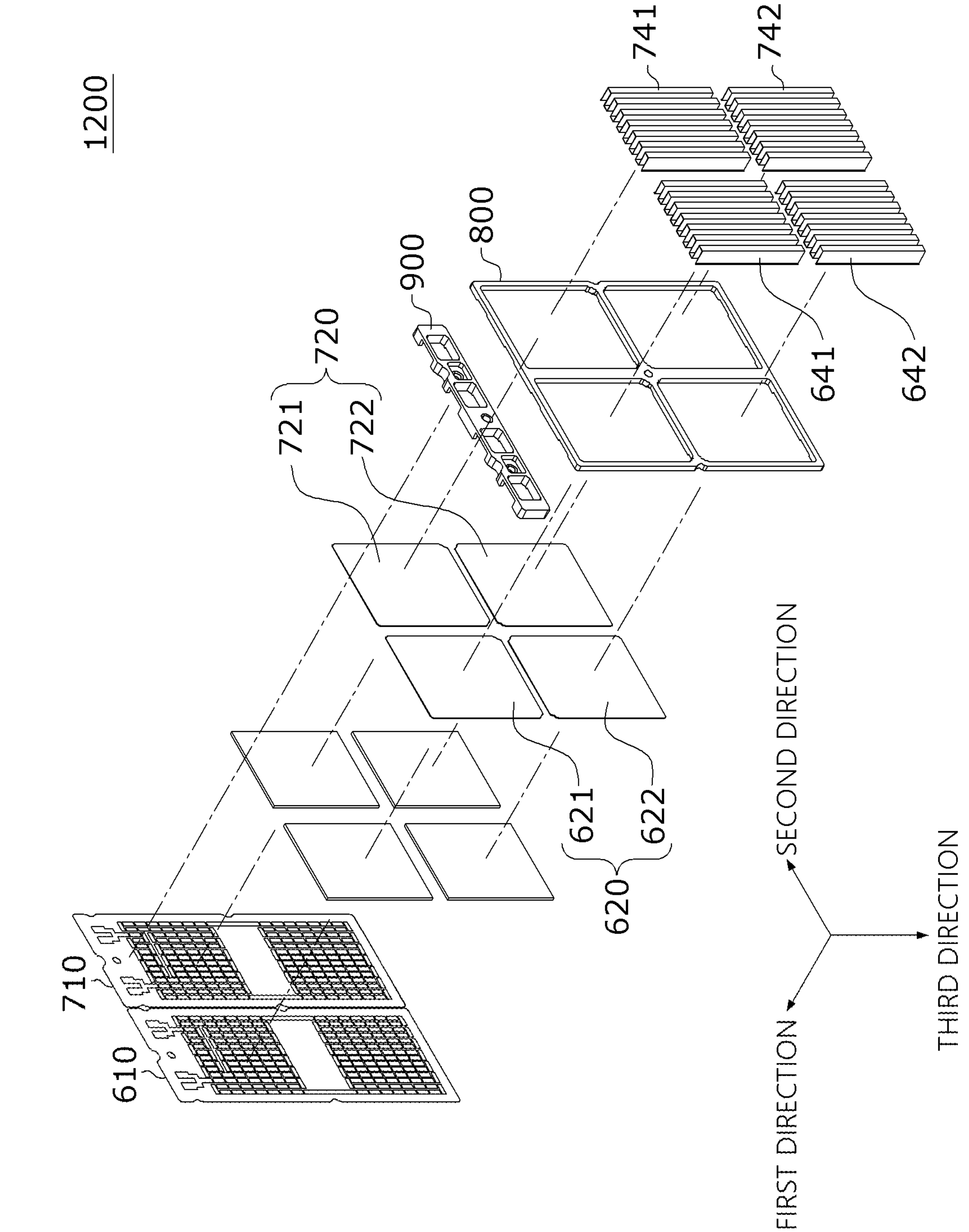
FIG. 11 is an exploded perspective view of the thermoelectric module according to one embodiment of the present invention.
Figure 12:
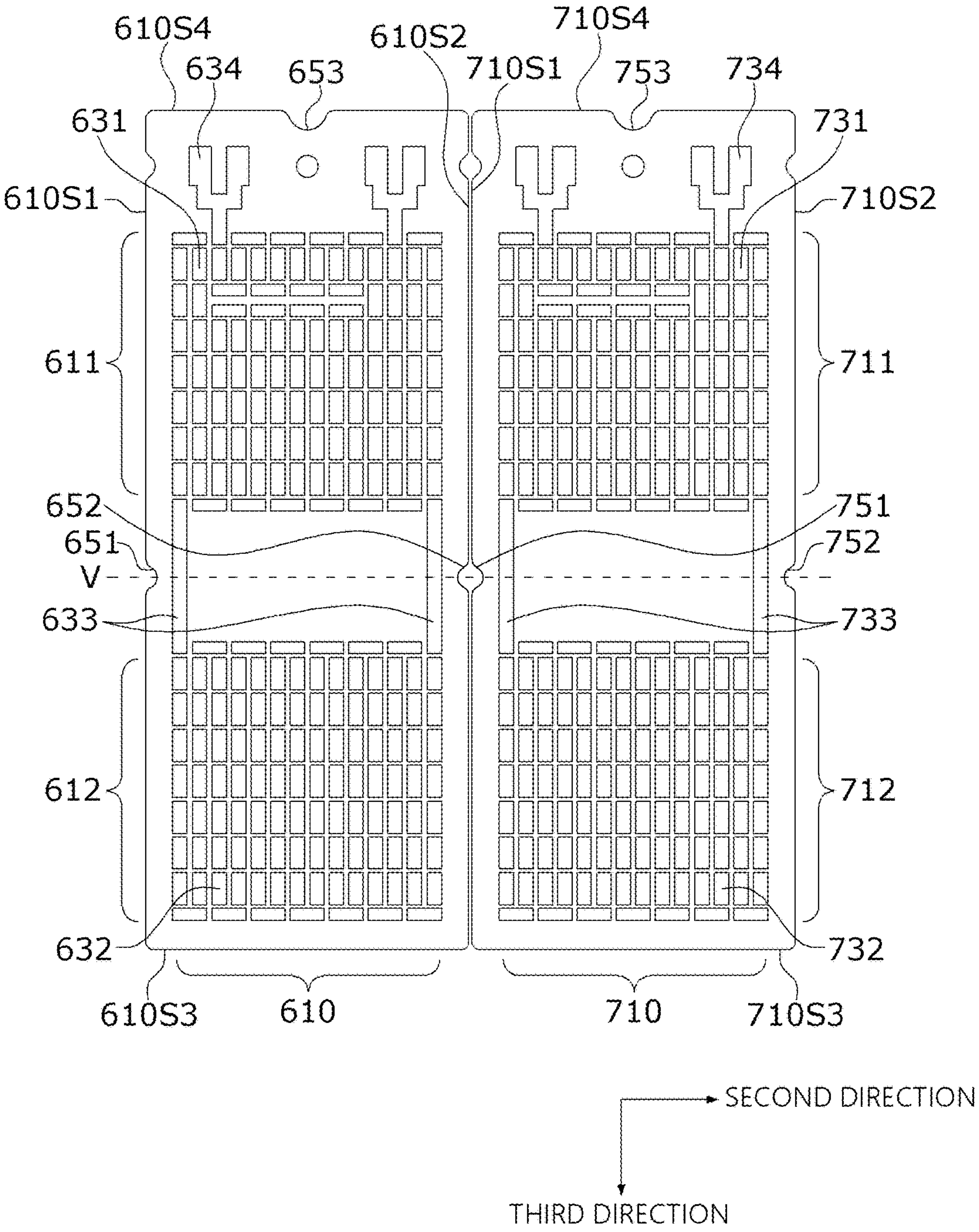
FIG. 12 shows a shape of an electrode portion disposed on a lower substrate of the thermoelectric module according to one embodiment of the present invention.
Figure 13:
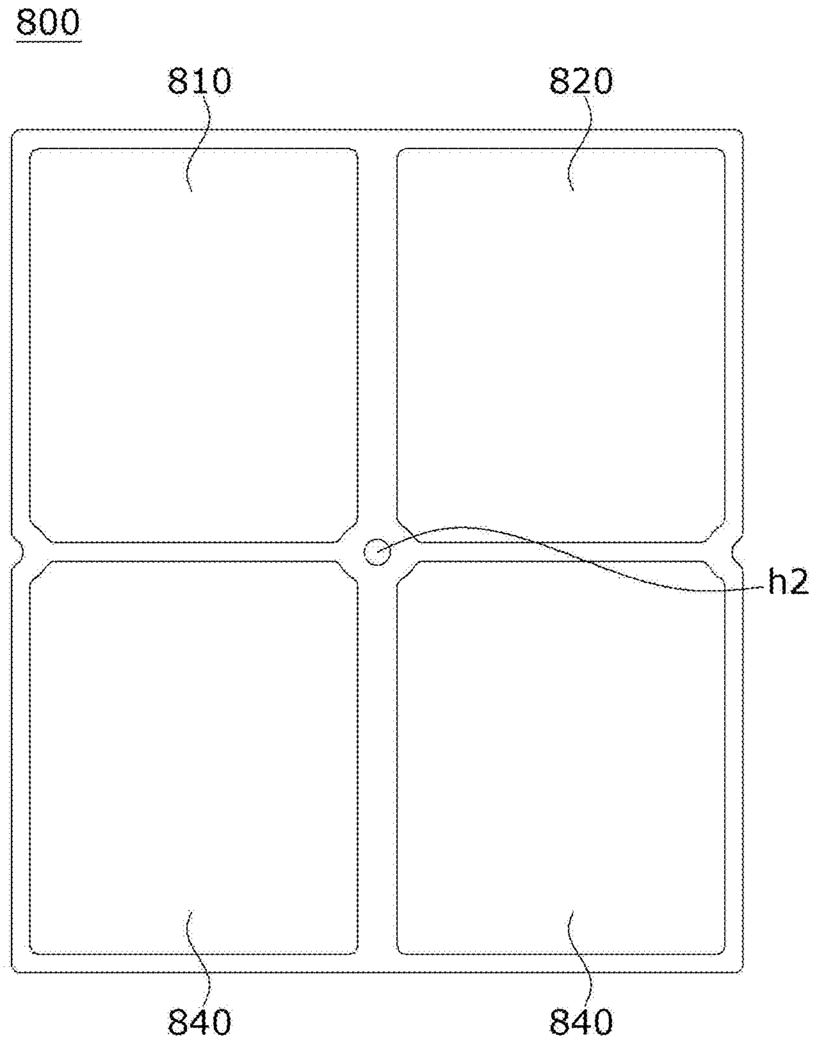
FIG. 13 is a plan view of a frame included in the thermoelectric module according to one embodiment of the present invention.
Figure 14:
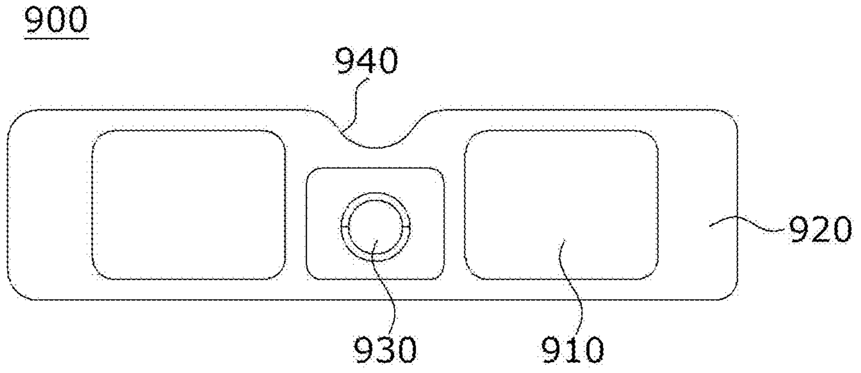
FIG. 14 is a plan view of an insulating member included in the thermoelectric module according to one embodiment of the present invention.
Figure 15:
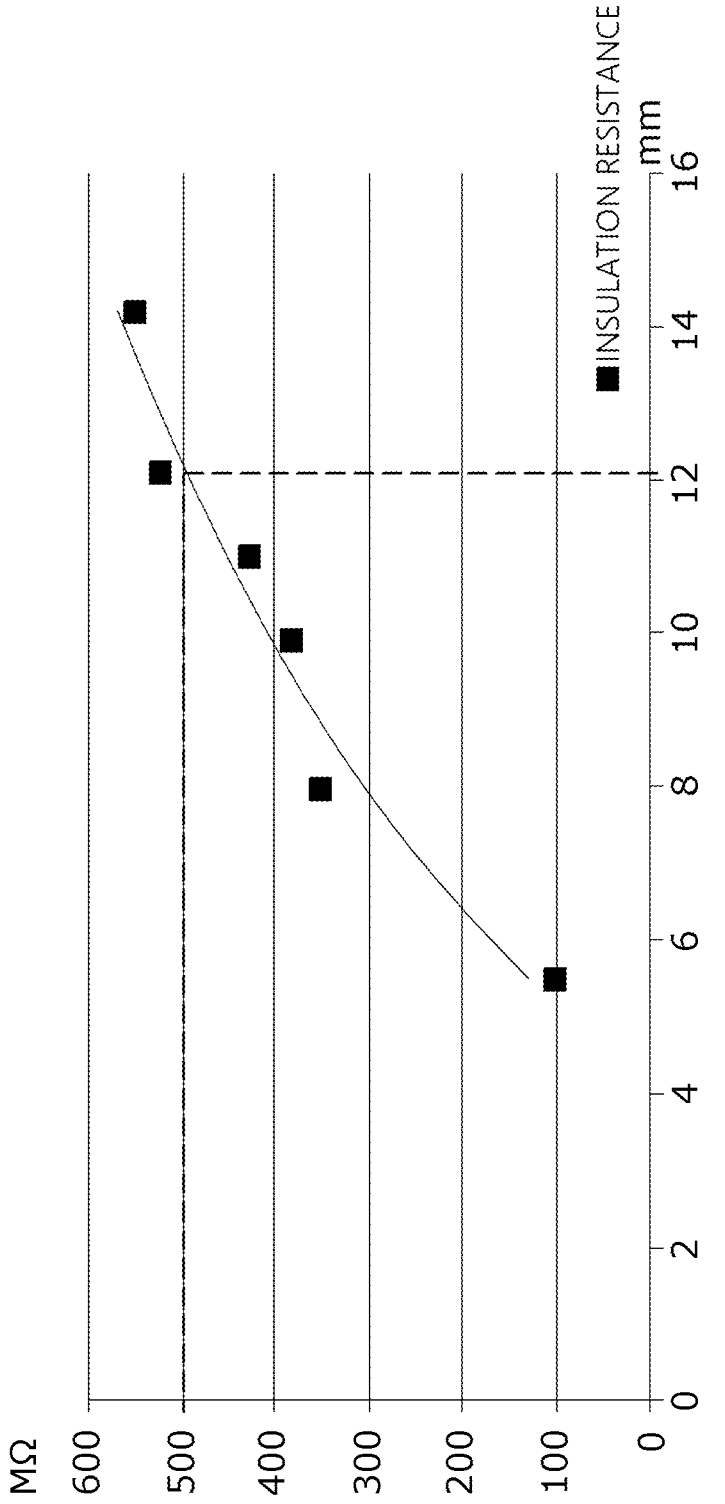
FIG. 15 is a graph showing insulation resistance according to an insulation distance.

FIG. 9 is a perspective view of a thermoelectric module according to one embodiment of the present invention, FIG. 10 is a plan view of the thermoelectric module according to one embodiment of the present invention, FIG. 11 is an exploded perspective view of the thermoelectric module according to one embodiment of the present invention, FIG. 12 shows a shape of an electrode portion disposed on a lower substrate of the thermoelectric module according to one embodiment of the present invention, FIG. 13 is a plan view of a frame included in the thermoelectric module according to one embodiment of the present invention, FIG. 14 is a plan view of an insulating member included in the thermoelectric module according to one embodiment of the present invention, and FIG. 15 is a graph showing insulation resistance according to an insulation distance.

Referring to FIGS. 9 to 14, a thermoelectric module 1200 includes a first thermoelectric module 600 and a second thermoelectric module 700 disposed adjacent to the first thermoelectric module 600. According to the embodiment of the present invention, a plurality of thermoelectric modules 1200 may be disposed on each of a first surface 1110 and a second surface 1120 of a fluid flow portion 1100. The thermoelectric module 1200 includes a thermoelectric element and a heat sink, and duplicate descriptions of the same contents as those described with reference to FIGS. 3 and 4 are omitted.

According to the embodiment of the present invention, the first thermoelectric module 600 includes a first lower substrate 610, a plurality of semiconductor elements disposed on the first lower substrate 610, and a first upper substrate 620 disposed on the plurality of semiconductor elements, and the second thermoelectric module 700 includes a second lower substrate 710, a plurality of semiconductor elements disposed on the second lower substrate 710, and a second upper substrate 720 disposed on the plurality of semiconductor elements. The first and second lower substrates 610 and 710 may be the first substrate 110 described with reference to FIGS. 3 and 4, the plurality of semiconductor elements may be the P-type semiconductor elements 130 and N-type semiconductor elements 140 described with reference to FIGS. 3 and 4, and the first and second upper substrates 620 and 720 may be the second substrate 160 described with reference to FIGS. 3 and 4.

According to the embodiment of the present invention, the first and second lower substrates 610 and 710 are disposed on the first surface 1110 of the fluid flow portion 1100. In this case, the first and second lower substrates 610 and 710 may be disposed to be in direct contact with the first surface 1110 of the fluid flow portion 1100, or may be disposed to be in indirect contact through a thermal interface material (TIM) or the like.

According to the embodiment of the present invention, the first lower substrate 610 may include first to fourth outer edges 610S1 to 610S4, the second lower substrate 710 may include first to fourth outer edges 710S1 to 710S4, the first outer edge 610S1 and the second outer edge 610S2 of the first lower substrate 610 may face each other, the third outer edge 610S3 and the fourth outer edge 610S4 of the first lower substrate 610 may face each other, the first outer edge 710S1 and the second outer edge 710S2 of the second lower substrate 710 may face each other, the third outer edge 710S3 and the fourth outer edge 710S4 of the second lower substrate 710 may face each other, and the first outer edge 610S1 and the second outer edge 610S2 of the first lower substrate 610 and the first outer edge 710S1 and the second outer edge 710S2 of the second lower substrate 710 may be sequentially disposed along a second direction.

The plurality of semiconductor elements disposed on the first lower substrate 610 include 1-1 semiconductor elements disposed in a first region 611 of the first lower substrate 610 and 1-2 semiconductor elements disposed in a second region 612 of the first lower substrate 610, and the plurality of semiconductor elements disposed on the second lower substrate 710 include 2-1 semiconductor elements disposed in a third region 711 of the second lower substrate 710 and 2-2 semiconductor elements disposed in a fourth region 712 of the second lower substrate 710. A 1-1 electrode portion 631 is disposed between the first region 611 of the first lower substrate 610 and the 1-1 semiconductor elements, a 1-2 electrode portion 632 is disposed between the second region 612 of the first lower substrate 610 and the 1-2 semiconductor elements, a 2-1 electrode portion 731 is disposed between the third region 711 of the second lower substrate 710 and the 2-1 semiconductor elements, and a 2-2 electrode portion 732 is disposed between the fourth region 714 of the second lower substrate 710 and the 2-2 semiconductor elements. The 1-1 electrode portion 631 and the 1-2 electrode portion 632 are connected by a connecting electrode 633, and the 2-1 electrode portion 731 and the 2-2 electrode portion 732 are connected by a connecting electrode 733.

The first upper substrate 620 includes a 1-1 upper substrate 621 disposed on the 1-1 semiconductor elements and a 1-2 upper substrate 622 disposed on the 1-2 semiconductor elements, and the second upper substrate 720 includes a 2-1 upper substrate 721 disposed on the 2-1 semiconductor elements and a 2-2 upper substrate 722 disposed on the 2-2 semiconductor elements. A 1-1 heat sink 641 is disposed on the 1-1 upper substrate 621, a 1-2 heat sink 642 is disposed on the 1-2 upper substrate 622, a 2-1 heat sink 741 is disposed on the 2-1 upper substrate 721, and a 2-2 heat sink 742 is disposed on the 2-2 upper substrate 722.

According to the embodiment of the present invention, a longitudinal length of the connecting electrodes 633 and 733 may be two to four times a longitudinal length of the electrodes included in the 1-1 electrode portion 631, the 1-2 electrode portion 632, the 2-1 electrode portion 731, and the 2-2 electrode portion 732. Accordingly, since a distance between the 1-1 heat sink 641 and the 1-2 heat sink 642 and a distance between the 2-1 heat sink 741 and the 2-2 heat sink 742 may be guaranteed to be a predetermined distance or more, interference between the heat sinks may be prevented and work efficiency may be improved.

A frame 800 may be further disposed on the first lower substrate 610 and the second lower substrate 710. The frame 800 may include an insulating material and may be disposed between the 1-1 upper substrate 621, the 1-2 upper substrate 622, the 2-1 upper substrate 721, and the 2-2 upper substrate 722. Accordingly, the frame 800 may separate the 1-1 upper substrate 621, the 1-2 upper substrate 622, the 2-1 upper substrate 721, and the 2-2 upper substrate 722.

According to the embodiment of the present invention, the first thermoelectric module 600 includes a first groove 650, and the second thermoelectric module 700 includes a second groove 750. According to the embodiment of the present invention, the first groove 650 is formed in the first lower substrate 610, and the second groove 750 is formed in the second lower substrate 710. The first groove 650 includes a 1-1 groove 651 and a 1-2 groove 652, and the 1-1 groove 651 may be formed in a first outer edge 610S1 which is one outer edge of the first lower substrate 610, and the 1-2 groove 652 may be formed in a second outer edge 610S2 which is another outer edge of the first lower substrate 610. The second groove 750 includes a 2-1 groove 751 and a 2-2 groove 752, and the 2-1 groove 751 may be formed in a first outer edge 710S1 which is one outer edge of the second lower substrate 710, and the 2-2 groove 752 may be formed in a second outer edge 710S2 which is another outer edge of the second lower substrate 710. In this case, an imaginary line V connecting the center of the 1-1 groove 651 and the center of the 1-2 groove 652 may be disposed in a region that vertically overlaps a region between the 1-1 upper substrate 621 and the 1-2 upper substrate 622. An imaginary line connecting the center of the 2-1 groove 751 and the center of the 2-2 groove 752 may be disposed in a region that vertically overlaps a region between the 2-1 upper substrate 721 and the 2-2 upper substrate 722. The 1-1 groove 651 and the 1-2 groove 652 may be disposed to overlap each other along a direction perpendicular to a direction in which the connecting electrode 633 connecting the 1-1 electrode portion 631 and the 1-2 electrode portion 632 extends. The 2-1 groove 751 and the 2-2 groove 752 may be disposed to overlap each other along a direction perpendicular to a direction in which the connecting electrode 733 connecting the 2-1 electrode portion 731 and the 2-2 electrode portion 732 extends.

In this case, the 1-2 groove 652 and the 2-1 groove 751 are disposed at positions corresponding to each other, and the 1-2 groove 652 and the 2-1 groove 751 may form one hole h1. The hole h1 formed by the 1-2 groove 652 and the 2-1 groove 751 may be a hole for a fastening member (not shown) to pass through.

Furthermore, the frame 800 may include a hole h2 corresponding to the hole h1 formed by the 1-2 groove 652 and the 2-1 groove 751. The fastening member (not shown) may pass through the hole h2 and the hole h1, and accordingly, the first thermoelectric module 600 and the second thermoelectric module 700 according to the embodiment of the present invention may be simultaneously fixed by one fastening member. Accordingly, since the fastening member does not need to pass through within an effective region where the semiconductor elements are disposed, the disposition of the electrode portion and the semiconductor elements may be easy and the thermoelectric performance per unit area may be improved. A plurality of 1-2 grooves 652 and a plurality of 2-1 grooves 751 are disposed at positions corresponding to each other, and a plurality of 1-2 grooves 652 and a plurality of 2-1 grooves 751 may form a plurality of holes h1.

In this case, a head portion of the fastening member (not shown) may be disposed on an upper edge of the hole h2 of the frame 800. To this end, a corner adjacent to the hole h2 among four corners of the 1-1 upper substrate 621, a corner adjacent to the hole h2 among four corners of the 1-2 upper substrate 622, a corner adjacent to the hole h2 among four corners of the 2-1 upper substrate 721, and a corner adjacent to the hole h2 among four corners of the 2-2 upper substrate 722 may include first to fourth cut portions 621C, 622C, 721C, and 722C, respectively. Here, the cut portion may refer to a chamfer shape. According to the embodiment of the present invention, the frame 800 may include first to fourth openings 810, 820, 830, and 840 surrounding the 1-1 upper substrate 621, the 1-2 upper substrate 622, the 2-1 upper substrate 721, and the 2-2 upper substrate 722, respectively, to be disposed between the 1-1 upper substrate 621, the 1-2 upper substrate 622, the 2-1 upper substrate 721, and the 2-2 upper substrate 722. The first to fourth openings 810, 820, 830, and 840 of the frame 800 may have shapes corresponding to the outer edges of the 1-1 upper substrate 621, the 1-2 upper substrate 622, the 2-1 upper substrate 721, and the 2-2 upper substrate 722, respectively. That is, among the four corners of each of the first to fourth openings 810, 820, 830, and 840 of the frame 800, the corner adjacent to the hole h2 may have a shape corresponding to the first to fourth cut portions 621C, 622C, 721C, and 722C of the 1-1 upper substrate 621, the 1-2 upper substrate 622, the 2-1 upper substrate 721, and the 2-2 upper substrate 722.

Although not shown, as described with reference to FIGS. 3 and 4, a first insulating layer may be disposed between the first lower substrate 610 and the plurality of semiconductor elements, and a second insulating layer may be disposed between the plurality of semiconductor elements and the first upper substrate 620. A third insulating layer may be further disposed between the first insulating layer and the plurality of semiconductor elements.

As described above, the 1-1 electrode portion 631 and the 1-2 electrode portion 632 may be disposed between the first lower substrate 610 and a plurality of semiconductor elements, and the 2-1 electrode portion 731 and the 2-2 electrode portion 732 may be disposed between the second lower substrate 710 and a plurality of semiconductor elements.

Furthermore, an extension electrode 634 extending toward a fourth outer edge 610S4 of the first lower substrate 610 may be further disposed on the first lower substrate 610. In the embodiment of the present invention, the second fluid may flow in a direction from the fourth outer edge 610S4 toward the third outer edge 610S3. That is, the extension electrode 634 may be disposed toward the direction in which the second fluid flows in. An area of the extension electrode 634 may be larger than an area of each electrode forming the 1-1 electrode portion 631 and the 1-2 electrode portion 632. A connector is disposed on the extension electrode 634, and a wire may be connected to the connector.

According to the embodiment of the present invention, an insulating member 900 is further disposed on the extension electrode 634. Although one insulating member 900 is shown as being disposed on the first thermoelectric module 600 and the second thermoelectric module 700, the embodiment of the present invention is not limited thereto, and the insulating member may be disposed on each of the thermoelectric modules. The insulating member 900 may maintain a uniform bonding force between the first and second thermoelectric modules 600 and 700 and the fluid flow portion 1100 and protect the wire connected to the connector.

According to the embodiment of the present invention, the insulating member 900 may include an insulating frame 920 in which an opening 910 is formed, and the opening 910 may be disposed at a position corresponding to the extension electrode 634, and the opening 910 may be filled with a resin. Accordingly, a resin may be disposed on the extension electrode 634 to provide insulation, and a withstand voltage performance of the first and second thermoelectric modules 600 and 700 may be enhanced. Here, the resin may include an epoxy resin or a silicone resin. When the insulating frame 920 includes a plastic material, the insulating frame 920 may be easily molded into various sizes and shapes. For example, the insulating frame 920 may be a plastic material applicable at high temperatures, such as polyphenylene sulfide (PPS). Accordingly, the problem of the shape of the insulating frame 920 being deformed by the high-temperature second fluid may be prevented.

According to the embodiment of the present invention, a through hole 930 may be formed between the openings 910 of the insulating frame 920, and the fastening member may be fastened to the through hole 930.

According to the embodiment of the present invention, the insulating member 900 may be disposed on each of the first thermoelectric module 600 and the second thermoelectric module 700, or one insulating member 900 may be disposed on the first thermoelectric module 600 and the second thermoelectric module 700.

According to the embodiment of the present invention, a 1-3 groove 653 and a 2-3 groove 753 may be further disposed in the fourth outer edge 610S4 of the first lower substrate 610 and the fourth outer edge 710S4 of the second lower substrate 710, respectively, and a groove 940 corresponding to the 1-3 groove 653 and the 2-3 groove 753 may be further disposed in the insulating member 900. The 1-3 groove 653 and the 2-3 groove 753 respectively disposed on the fourth outer edge 610S4 of the first lower substrate 610 and the fourth outer edge 710S4 of the second lower substrate 710 and the groove 940 disposed on the insulating member 900 may serve as portions for positioning, and the grooves may be aligned by engaging with the protrusion 1112 of the fluid flow portion 1100.

Referring to FIG. 15, in order to obtain an insulation resistance of 500 MΩ or more, an insulation distance of 12 mm or more has to be guaranteed. In the present specification, the insulation distance may refer to a shortest insulation distance from the effective region where the semiconductor element is disposed to the outer edge of the substrate. When the insulating frame 920 is disposed on the extension electrode 634 as in the embodiment of the present invention, the insulation distance may be increased by the height of the insulating frame 920, and accordingly, a higher insulation resistance may be obtained. For example, the shortest insulation distance may be defined by (2*the height of the insulating frame+the length of the insulating frame). Here, the height of the insulating frame may be defined as the height based on the lower substrate in the first direction, and the length of the insulating frame may be defined as the length in the third direction.

According to the embodiment of the present invention, a ratio of a distance from the fourth outer edge 610S4 of the first lower substrate 610 to the closest semiconductor element among the plurality of semiconductor elements to a distance from the extension electrode 634 to the fourth outer edge 610S4 of the first lower substrate 610 may be 1.5 times or more and 3.5 times or less. According to the embodiment of the present invention, a ratio of a height of the insulating frame 920 to the distance from the extension electrode 634 to the fourth outer edge 610S4 of the first lower substrate 610 may be 0.25 times or more and 0.7 times or less. For example, the distance from the fourth outer edge 610S4 of the first lower substrate 610 to the closest semiconductor element among the plurality of semiconductor elements may be 9 mm to 21 mm, the distance from the extension electrode 634 to the fourth outer edge 610S4 of the first lower substrate 610 may be 3 mm to 14 mm, and the height of the insulating frame 920 may be 1.5 mm to 4 mm. That is, even when the distance from the extension electrode 634 to the fourth outer edge 610S4 of the first lower substrate 610 is 3 mm, the insulation distance of 12 mm may be guaranteed due to the insulating frame 920. Accordingly, in addition to satisfying high insulation resistance, the area of the effective region where the semiconductor elements are disposed may be maximized to obtain the thermoelectric performance, and the insulating frame 920 may not hinder the flow path of the second fluid passing through the heat sink.

As described above, according to the embodiment of the present invention, the frame 800 may be disposed to surround the first to fourth upper substrates. Since the frame 800 includes the insulating material, the insulation distance of the thermoelectric module may be further increased due to the frame 800.

Here, it is described that the thermoelectric module 1200 includes the first thermoelectric module 600 and the second thermoelectric module 700, and that the first and second thermoelectric modules 600 and 700 include first and second lower substrates 610 and 710, respectively, but the embodiment is not limited thereto. According to another embodiment of the present invention, the first and second lower substrates 610 and 710 may be implemented as one lower substrate, the first to fourth upper substrates 621, 622, 721, and 722 may be disposed on the one lower substrate, and holes may be formed in the frame 800 and the lower substrate to correspond to a separation region between the first to fourth upper substrates 621, 622, 721, and 722.

Meanwhile, referring to FIGS. 1 and 2, a shield member 1500 may be further disposed to prevent moisture or contaminants from penetrating into the thermoelectric module 1200. As described above, the fluid flow portion 1100 includes the first surface 1110 and the second surface 1120 spaced apart from the first surface 1110 in the first direction, and the thermoelectric module 1200 is disposed on each of the first surface 1110 and the second surface 1120 of the fluid flow portion 1100. The first fluid flows between the first surface 1110 and the second surface 1120 of the fluid flow portion 1100 along the second direction perpendicular to the first direction, and the second fluid, which has a higher temperature than the first fluid, flows along the heat sink 1220 of the thermoelectric module 1200 along the third direction perpendicular to the first and second directions. Here, the third direction may be a direction from the fourth surface 1140 of the fluid flow portion 1100 toward the third surface 1130.

Figure 22:
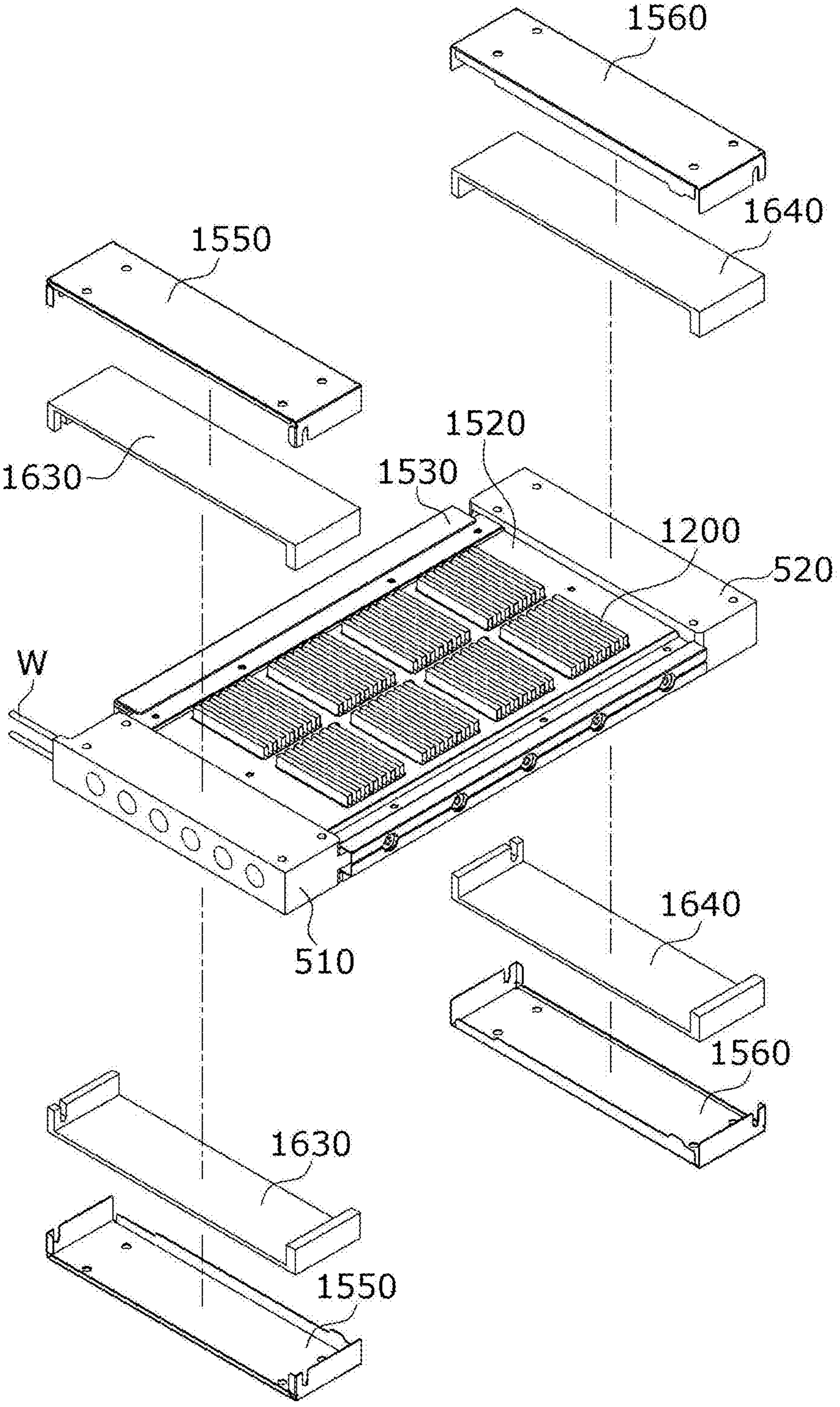
Figure 23:
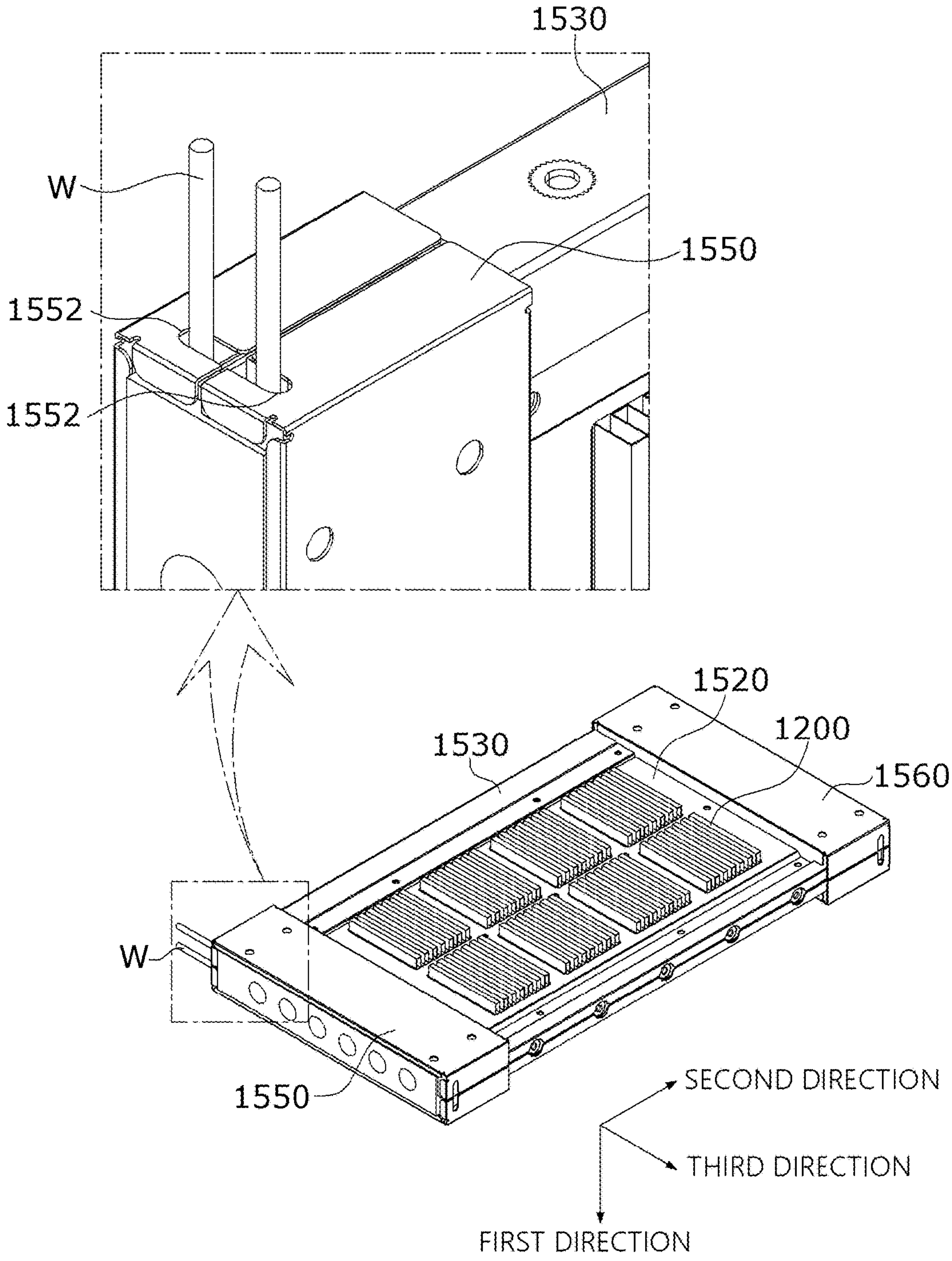
Figure 24:
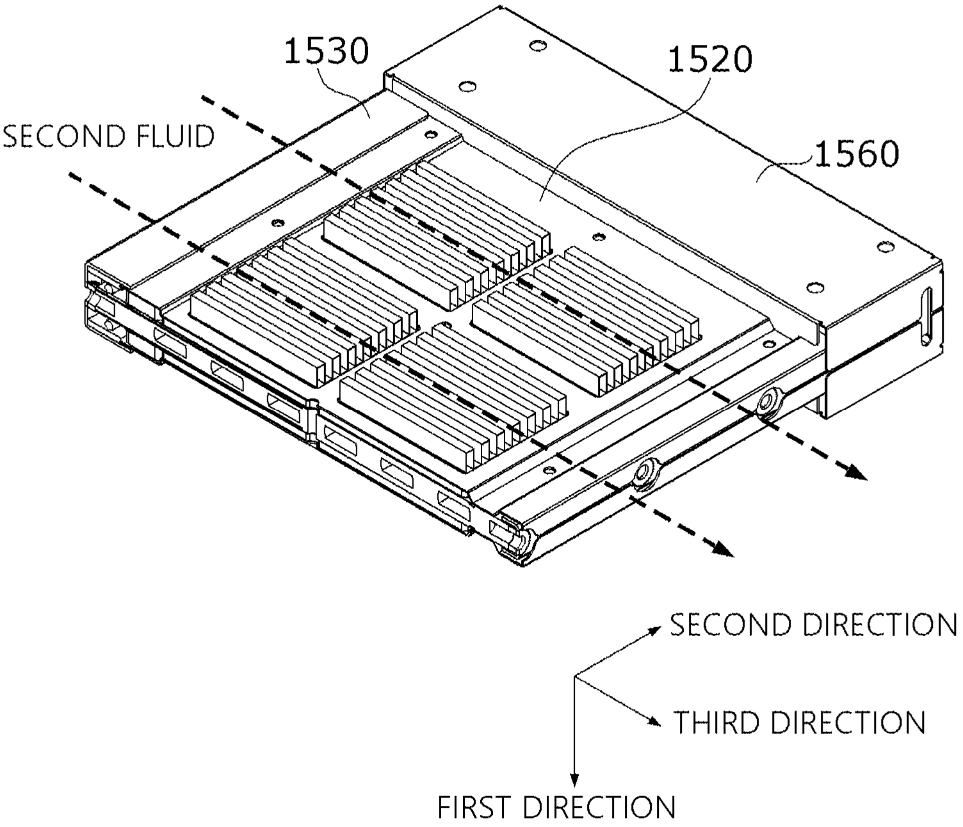
FIG. 24 is a cross-sectional view of the thermoelectric device according to one embodiment of the present invention in a state where the shield member is assembled thereto.
Figure 25:
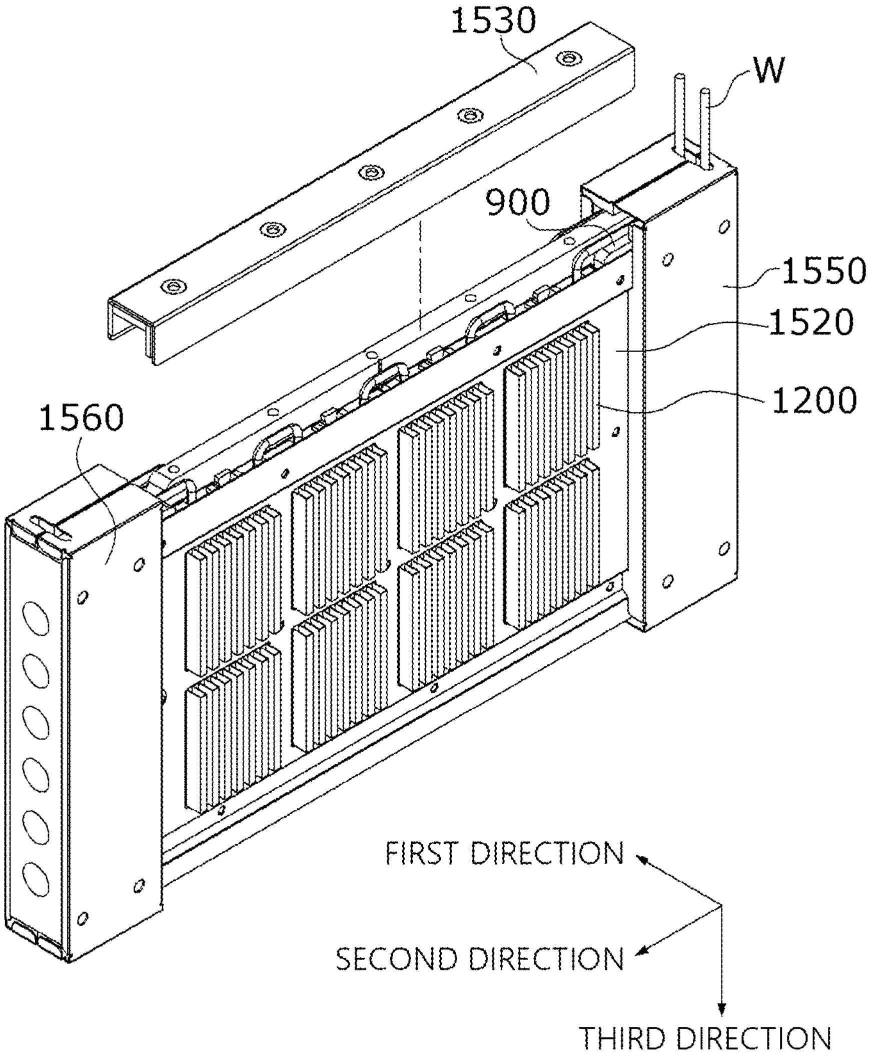
FIG. 25 is a perspective view of a state where a third shield member is removed from the thermoelectric device according to one embodiment of the present invention.

FIGS. 16 to 23 are views showing a process of assembling a shield member to a thermoelectric device according to one embodiment of the present invention, FIG. 24 is a cross-sectional view of the thermoelectric device according to one embodiment of the present invention in a state where the shield member is assembled thereto, and FIG. 25 is a perspective view of a state where the third shield member is removed from the thermoelectric device according to one embodiment of the present invention.

Figure 16:
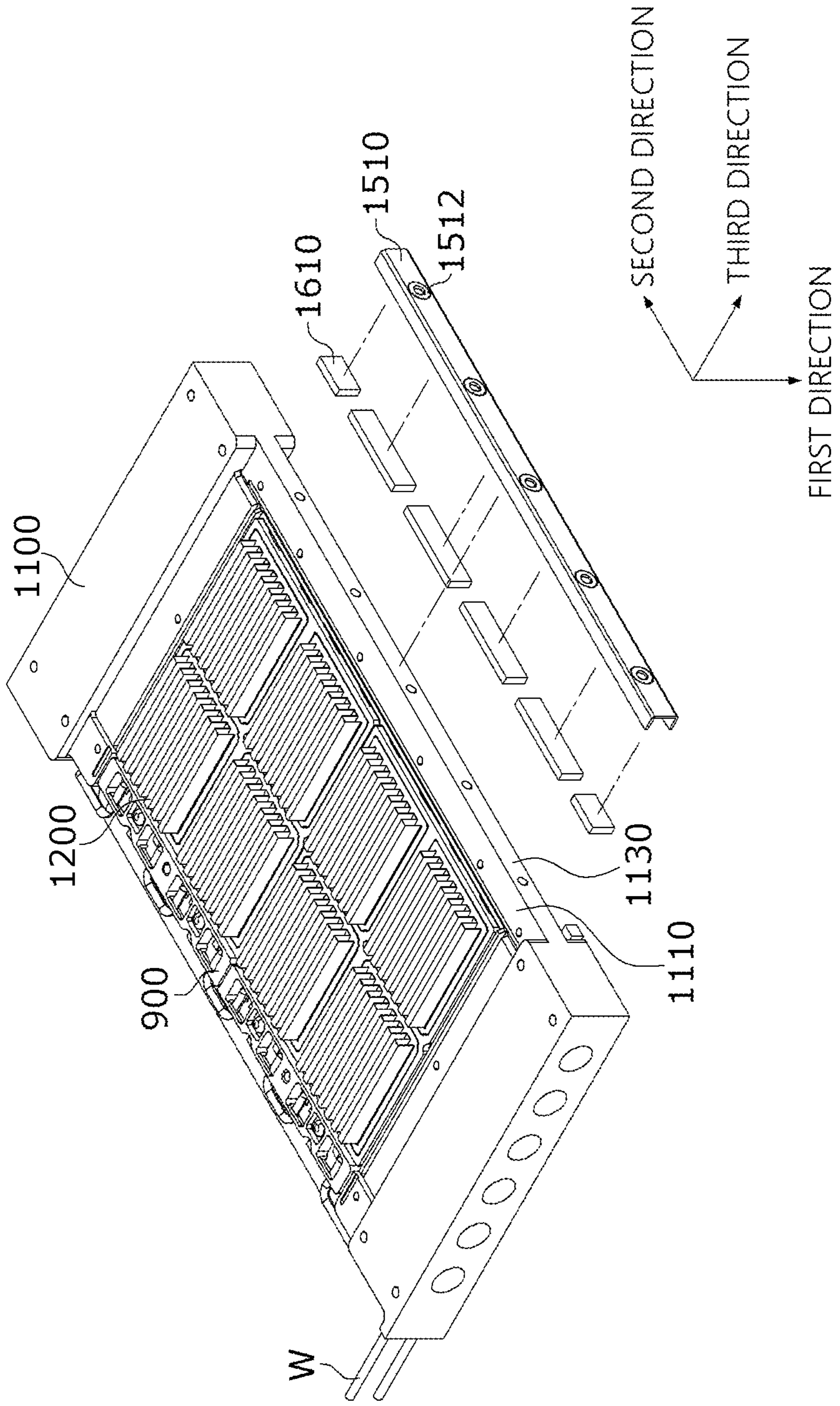
FIGS. 16 to 23 are views showing a process of assembling a shield member to a thermoelectric device according to one embodiment of the present invention.
Figure 17:
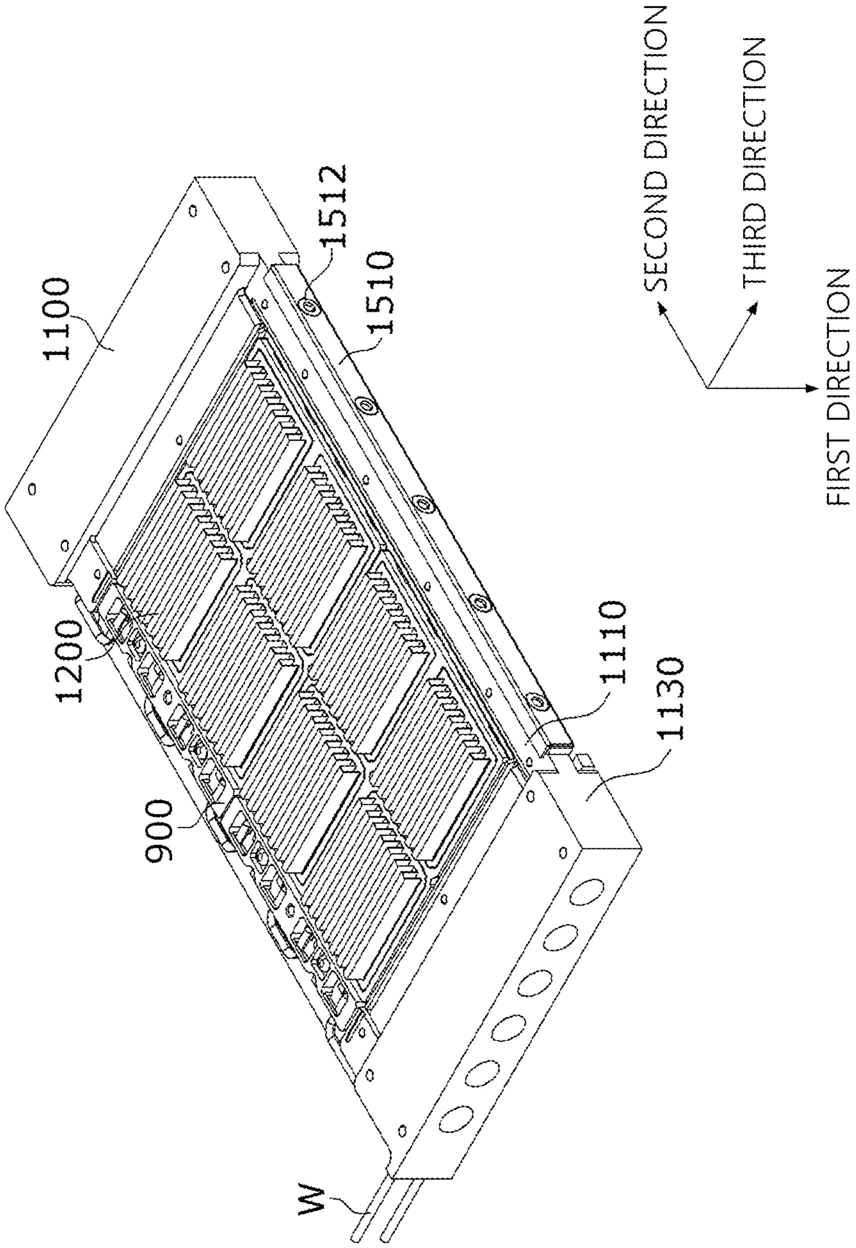

Referring to FIGS. 16 and 17, in a state where a thermoelectric module 1200 is assembled to each of a first surface 1110 and a second surface 1120 of a fluid flow portion 1100, a first shield member 1510 is disposed on a third surface 1130 of the fluid flow portion 1100.

The first shield member 1510 is disposed on the third surface 1130 of the fluid flow portion 1100, but may extend to cover a portion of the first surface 1110 and the second surface 1120 of the fluid flow portion 1100. For example, a cross-section of the first shield member 1510 may have a "C" shape. Accordingly, the first shield member 1510 may protect not only the third surface 1130 of the fluid flow portion 1100, but also a boundary between the first surface 1110 and the third surface 1130 and a boundary between the second surface 1120 and the third surface 1130.

In this case, a first insulating member 1610 may be additionally disposed between the fluid flow portion 1100 and the first shield member 1510. Accordingly, even when a high-temperature second fluid flows on the surface of the first shield member 1510, the effect on a first fluid within the fluid flow portion 1100 may be minimized. A fastening hole 1512 is formed in the first shield member 1510, and through the fastening hole 1512, the first shield member 1510 may be fastened to the third surface 1130 of the fluid flow portion 1100. Accordingly, the first insulating member 1610 may be disposed between the fastening holes 1512.

Figure 18:
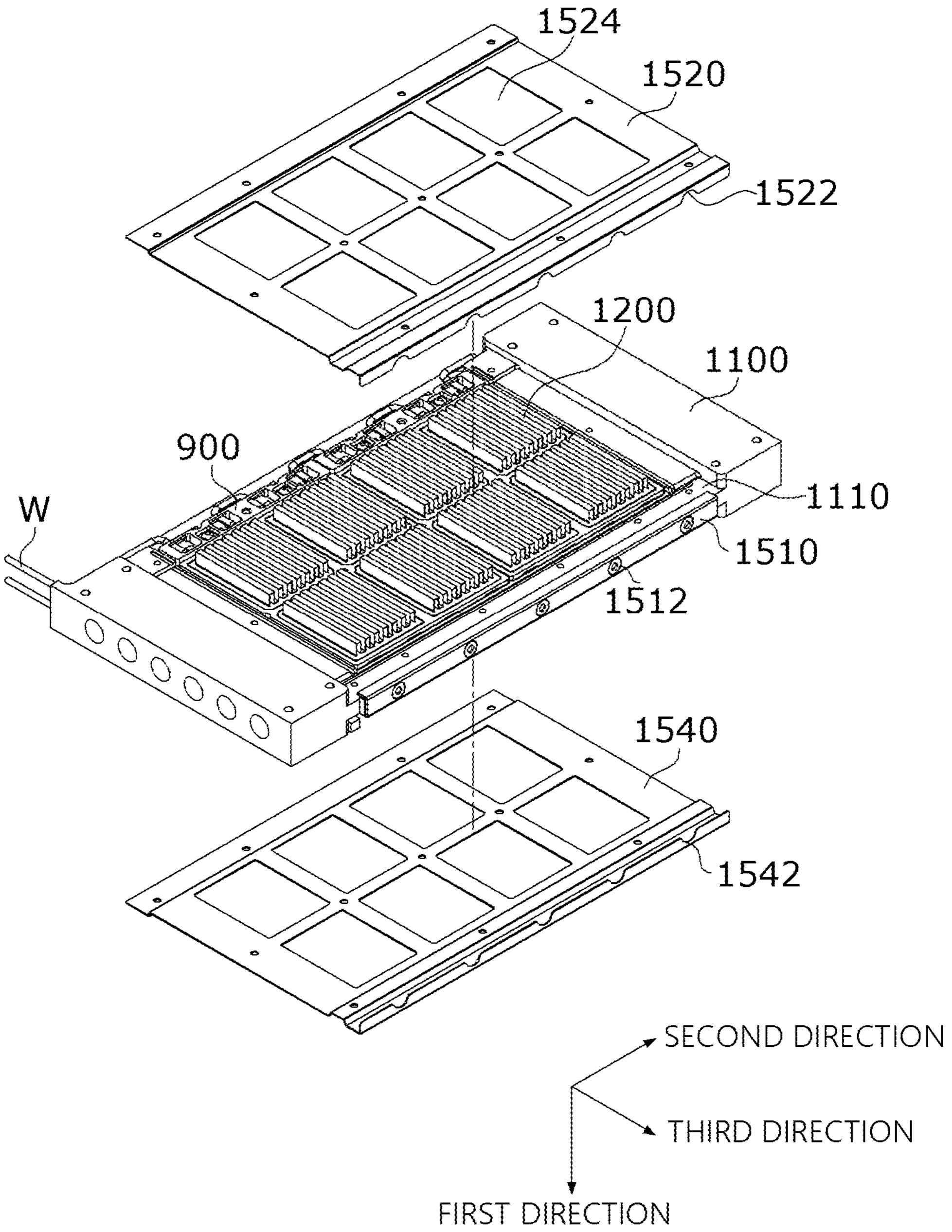
Figure 19:
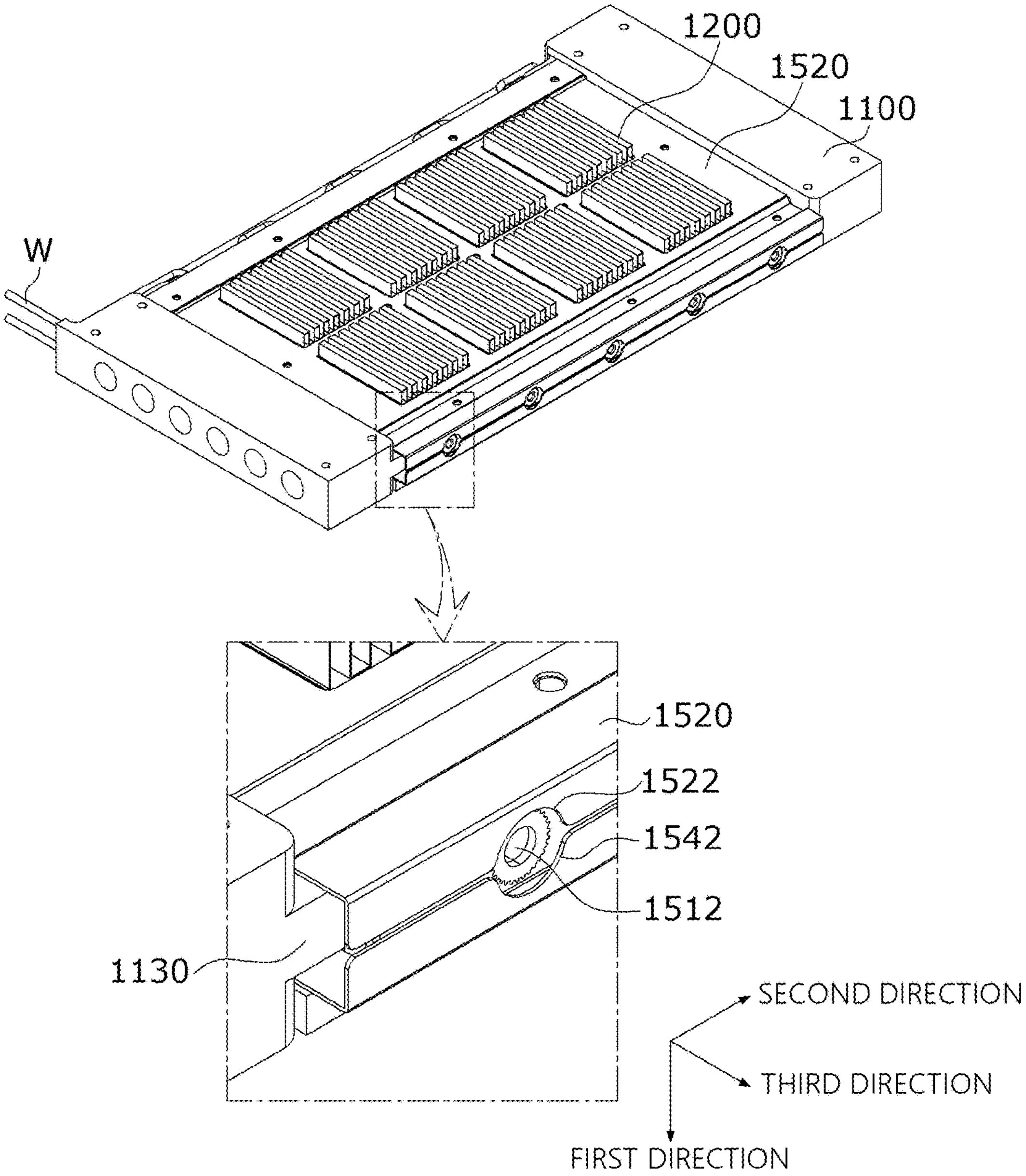

Next, referring to FIGS. 18 and 19, the thermoelectric module 1200 is assembled to each of the first surface 1110 and the second surface 1120 of the fluid flow portion 1100, and a second shield member 1520 is disposed on the first surface 1110 of the fluid flow portion 1100 and the thermoelectric module 1200 in a state where the first shield member 1510 is assembled to the third surface 1130 of the fluid flow portion 1100. In this case, the second shield member 1520 may extend to the third surface 1130 of the fluid flow portion 1100 to cover a portion of the first shield member 1510 disposed on the third surface 1130 of the fluid flow portion 1100. In addition, a fourth shield member 1540 symmetrical to the second shield member 1520 may be disposed on the second surface 1120 of the fluid flow portion 1100 and the thermoelectric module 1200, and the fourth shield member 1540 may be extended to the third surface 1130 of the fluid flow portion 1100 to cover a portion of the first shield member 1510 disposed on the third surface 1130 of the fluid flow portion 1100. Accordingly, since a gap between the first shield member 1510 and the second shield member 1520 and a gap between the first shield member 1510 and the fourth shield member 1540 are not directly disposed in a direction in which the second fluid flows, the problem of the second fluid flowing between the gap between the first shield member 1510 and the second shield member 1520 and the gap between the first shield member 1510 and the fourth shield member 1540 may be prevented.

Meanwhile, the second shield member 1520 and the fourth shield member 1540 may include grooves 1522 and 1542 disposed to correspond to each other, respectively, and the grooves 1522 and 1542 may be disposed on the third surface 1130 and may be disposed to correspond to the fastening hole 1512 of the first shield member 1510. Accordingly, the fastening member (not shown) may be fixed to the third surface 1130 of the fluid flow portion 1100 by passing through the hole formed by the grooves 1522 and 1542 of the second shield member 1520 and the fourth shield member 1540 and the fastening hole 1512 of the first shield member 1510.

As described above, the thermoelectric module 1200 may include a thermoelectric element disposed on the fluid flow portion 1100 and a heat sink disposed on the thermoelectric element, and the thermoelectric module 1200 may include a first thermoelectric module 600 and a second thermoelectric module 700 disposed adjacent to the first thermoelectric module 600.

According to the embodiment of the present invention, the second shield member 1520 may include a through hole 1524 through which the heat sink is exposed, and an edge of the through hole 1524 may be disposed on an upper substrate of the first thermoelectric module 600 and the second thermoelectric module 700. Accordingly, the high-temperature second fluid may flow along a third direction through the heat sink.

Figure 20:
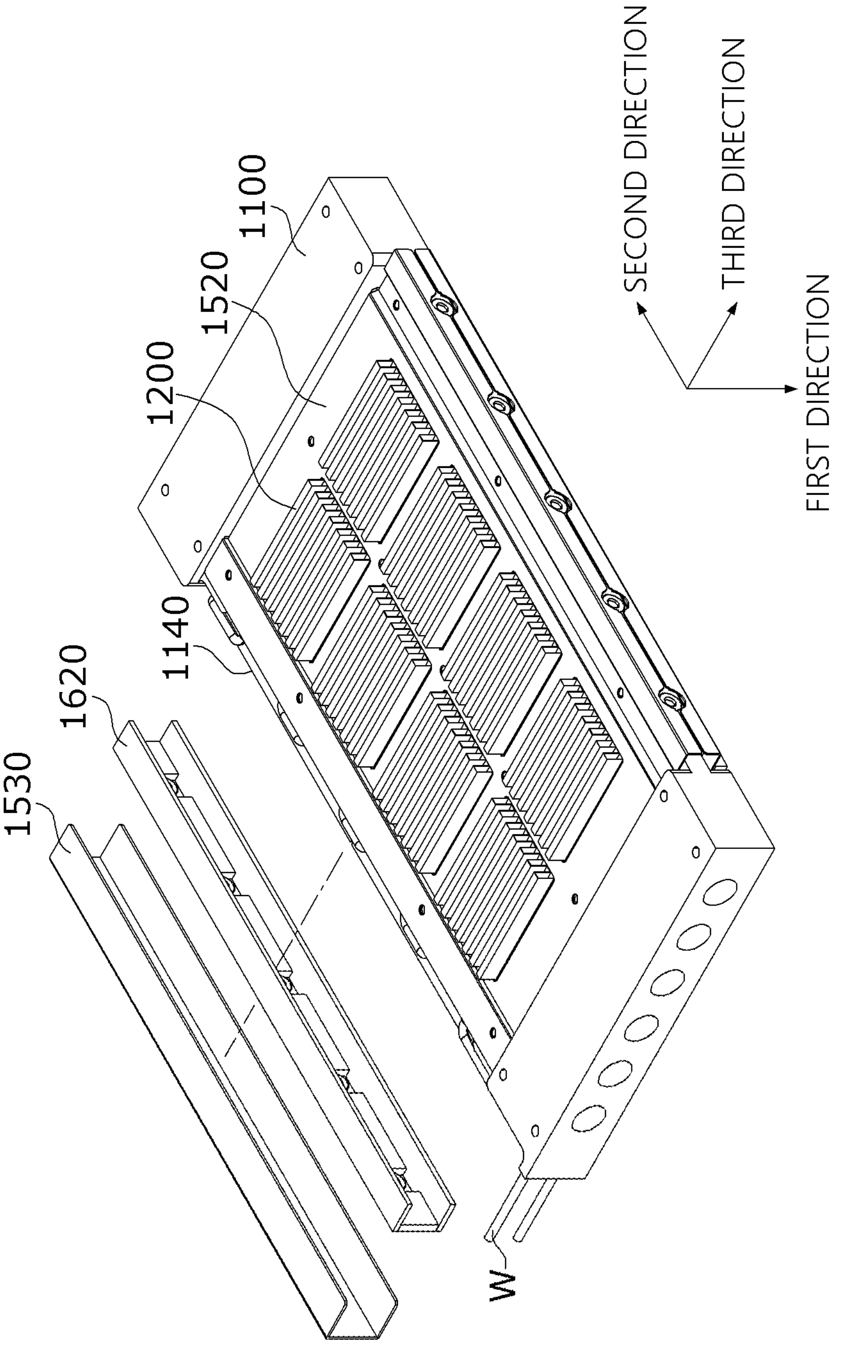
Figure 21:
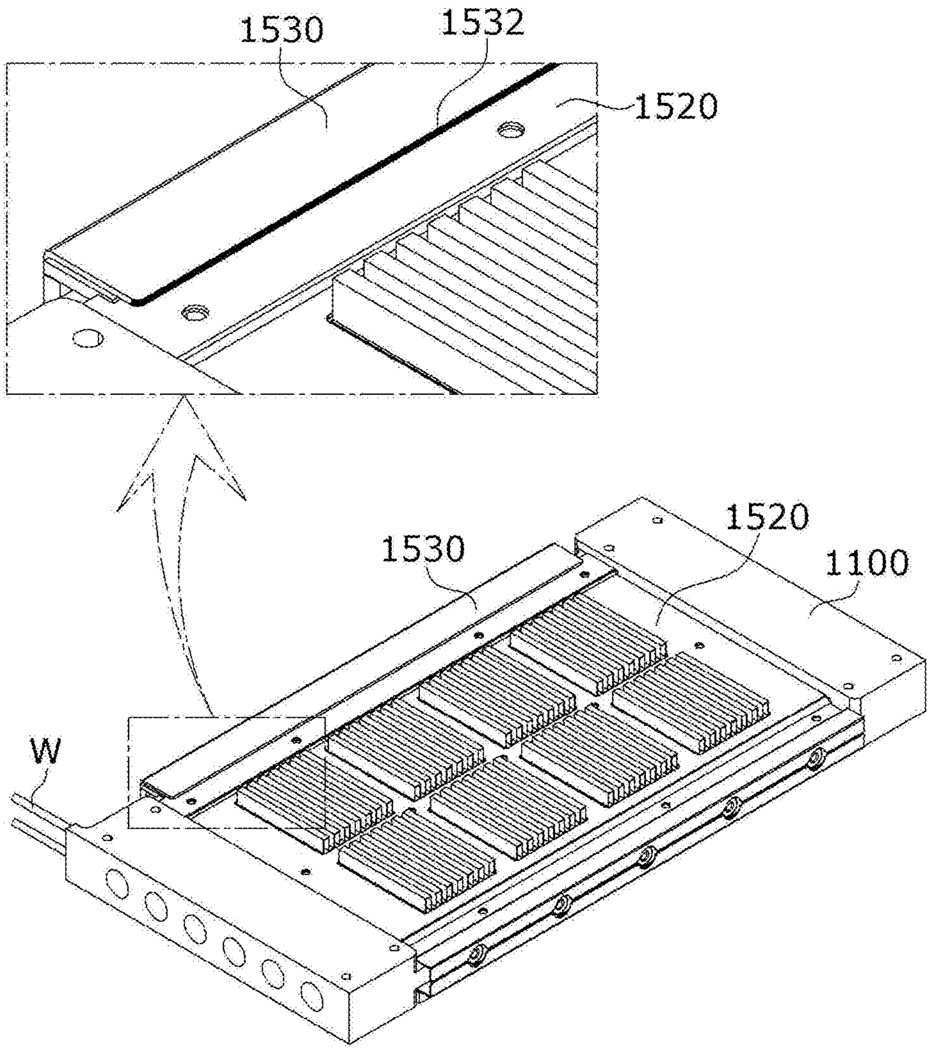

Next, referring to FIGS. 20 and 21, the thermoelectric module 1200 is assembled to each of the first surface 1110 and the second surface 1120 of the fluid flow portion 1100, the first shield member 1510 is assembled to the third surface 1130 of the fluid flow portion 1100, and the third shield member 1530 is disposed on the fourth surface 1140 of the fluid flow portion 1100 in a state where the second shield member 1520 and the fourth shield member 1540 are assembled to the first surface 1110 and the second surface 1120 of the fluid flow portion 1100.

A third shield member 1530 may be disposed on the fourth surface 1140 of the fluid flow portion 1100, but may extend to a portion of the first surface 1110 and the second surface 1120 of the fluid flow portion 1100. For example, the cross-section of the third shield member 1530 may have a "C" shape. Accordingly, the third shield member 1530 may protect not only the fourth surface 1140 of the fluid flow portion 1100, but also a boundary between the first surface 1110 and the fourth surface 1140 and a boundary between the second surface 1120 and the fourth surface 1140. In addition, in a structure in which the second fluid flows from the fourth surface 1140 toward the third surface 1130 on the first surface 1110 and the second surface 1120 of the fluid flow portion 1100, since a gap between the second and fourth shield members 1520 and 1540 and the third shield member 1530 is not directly exposed along the direction in which the second fluid flows when the third shield member 1530 is disposed on the second and fourth shield members 1520 and 1540, the problem of the second fluid seeping between the second and fourth shield members 1520 and 1540 and the third shield member 1530 may be minimized.

In this case, a second insulating member 1620 may be additionally disposed between the fluid flow portion 1100 and the third shield member 1530. Accordingly, even when a high-temperature second fluid flows on the surface of the third shield member 1530, the effect on a first fluid within the fluid flow portion 1100 may be minimized. In order to minimize the influence of the high-temperature second fluid on the first fluid within the fluid flow portion 1100, the second insulating member 1620 disposed between the fluid flow portion 1100 and the third shield member 1530 may also extend to a portion of the first surface 1110 and the second surface 1120 of the fluid flow portion 1100. Although not shown, a fastening hole is formed in the third shield member 1530, and through the fastening hole, the third shield member 1530 may be fastened to the fourth surface 1140 of the fluid flow portion 1100.

According to the embodiment of the present invention, a sealing member 1532 may be applied to the boundary between the third shield member 1530 and the second shield member 1520 and the boundary between the third shield member 1530 and the fourth shield member 1540. Accordingly, the problem of high-temperature second fluid penetrating into the boundary between the third shield member 1530 and the second shield member 1520 and the boundary between the third shield member 1530 and the fourth shield member 1540 may be prevented.

Meanwhile, as described with reference to FIGS. 5 to 8, the fluid flow portion 1100 includes the flow path region 500, the fluid inflow region 510, and the fluid discharge region 520. Furthermore, the thermoelectric module 1200 and the first to fourth shield members 1510, 1520, 1530, and 1540 are all disposed on the flow path region 500.

Referring to FIGS. 22 and 23, in a state where the thermoelectric module 1200 and the first to fourth shield members 1510, 1520, 1530, and 1540 are all disposed on the fluid flow portion 1100, a fifth shield member 1550 is further disposed on the fluid inflow region 510, and a sixth shield member 1560 is further disposed on the fluid discharge region 520. In this case, the fifth shield member 1550 and the sixth shield member 1560 may be extended to cover a portion of the third surface 1130 and the fourth surface 1140 of the fluid flow portion 1100, respectively. In addition, a third insulating member 1630 and a fourth insulating member 1640 may be further disposed between the fluid inflow region 510 and the fifth shield member 1550 and between the fluid discharge region 520 and the sixth shield member 1560, respectively.

Meanwhile, as described with reference to FIGS. 9 to 13, the extension electrode of the thermoelectric module may extend toward the direction in which the second fluid flows in, a connector may be disposed on the extension electrode, and a wire may be connected to the connector.

That is, when the second fluid flows from the fourth surface 1140 of the fluid flow portion 1100 toward the third surface 1130, the extension electrode, the connector, and the wire may be disposed toward the fourth surface 1140 of the fluid flow portion 1100. Accordingly, according to the embodiment of the present invention, the fifth shield member 1550 may include a groove 1552 disposed on the fourth surface 1140, and wire may be drawn out through the groove 1552.

Referring to FIG. 24, the second fluid flows along the third direction. That is, in a structure in which the third shield member 1530 is disposed on the second shield member 1520 and the second shield member 1520 is disposed on the first shield member 1510, the second fluid sequentially flows along the third shield member 1530, the second shield member 1520, and the first shield member 1510. Accordingly, the second fluid may pass along the third direction without seeping between the third shield member 1530 and the second shield member 1520 and between the second shield member 1520 and the first shield member 1510.

Referring to FIG. 25, according to the structure according to the embodiment of the present invention, only the third shield member 1530 may be removed from the thermoelectric device 1000, and accordingly, the extension electrode, the connector, the wire, and the like, may be exposed. In the case of a failure in the extension electrode, the connector, and the wire, repairs may be made by simply removing the third shield member 1530 without having to disassemble or replace the entire thermoelectric device 1000.

According to the embodiment of the present invention, a plurality of thermoelectric devices may form a thermoelectric system.

Figure 26:
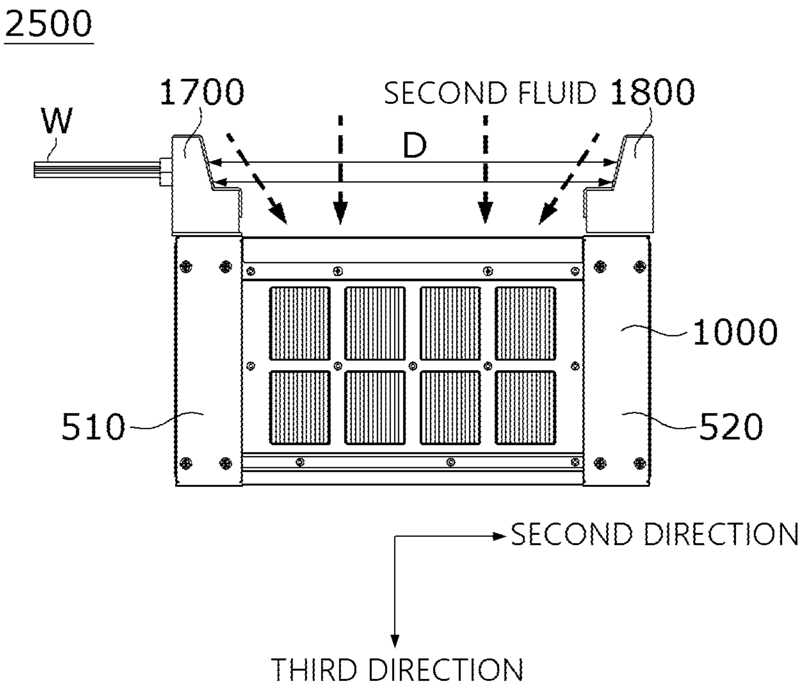
FIG. 26 shows a thermoelectric system according to one embodiment of the present invention.
Figure 27:
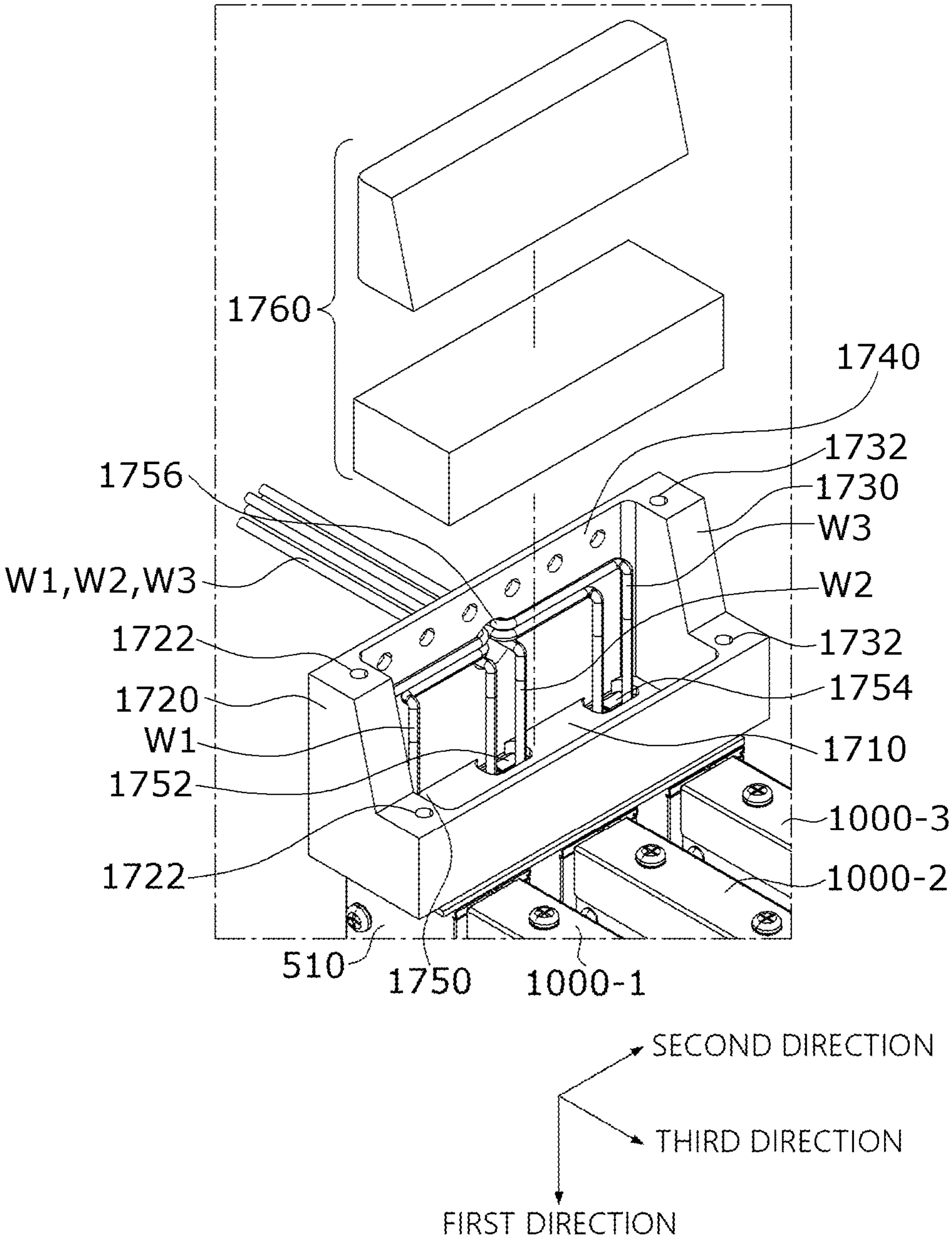
FIGS. 27 to 29 are views showing a process of assembling a wire protection portion in the thermoelectric system according to one embodiment of the present invention.
Figure 28:
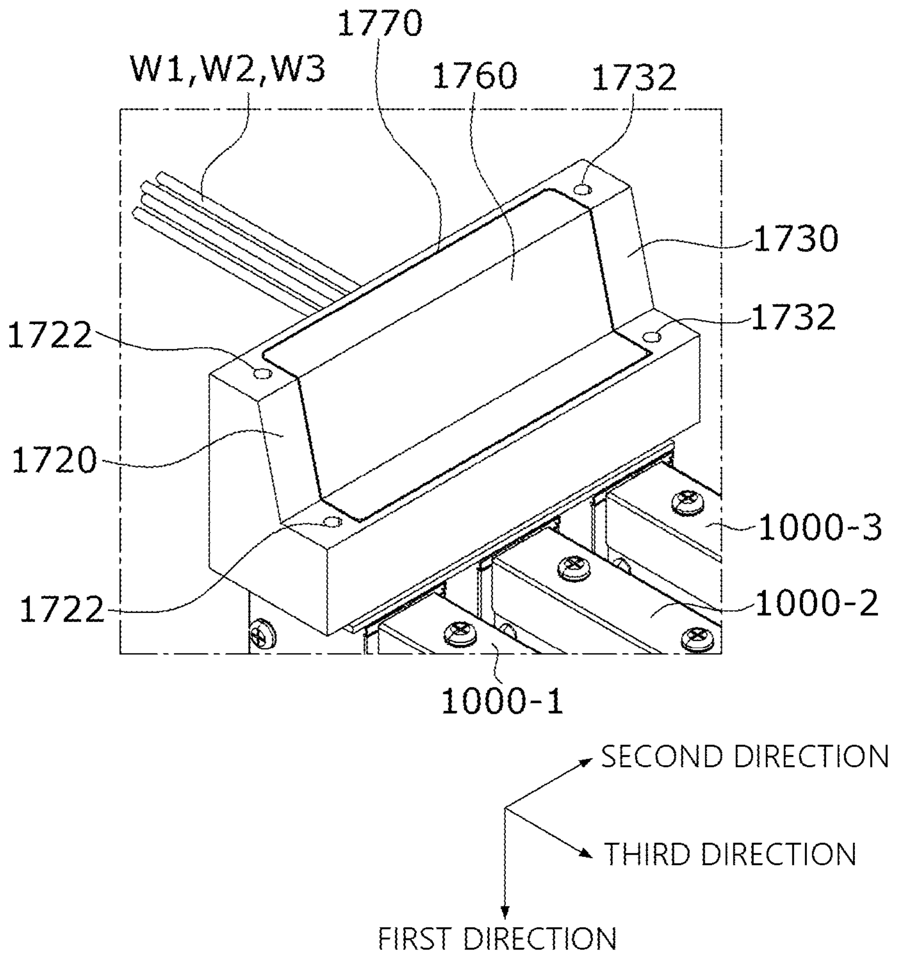
Figure 29:
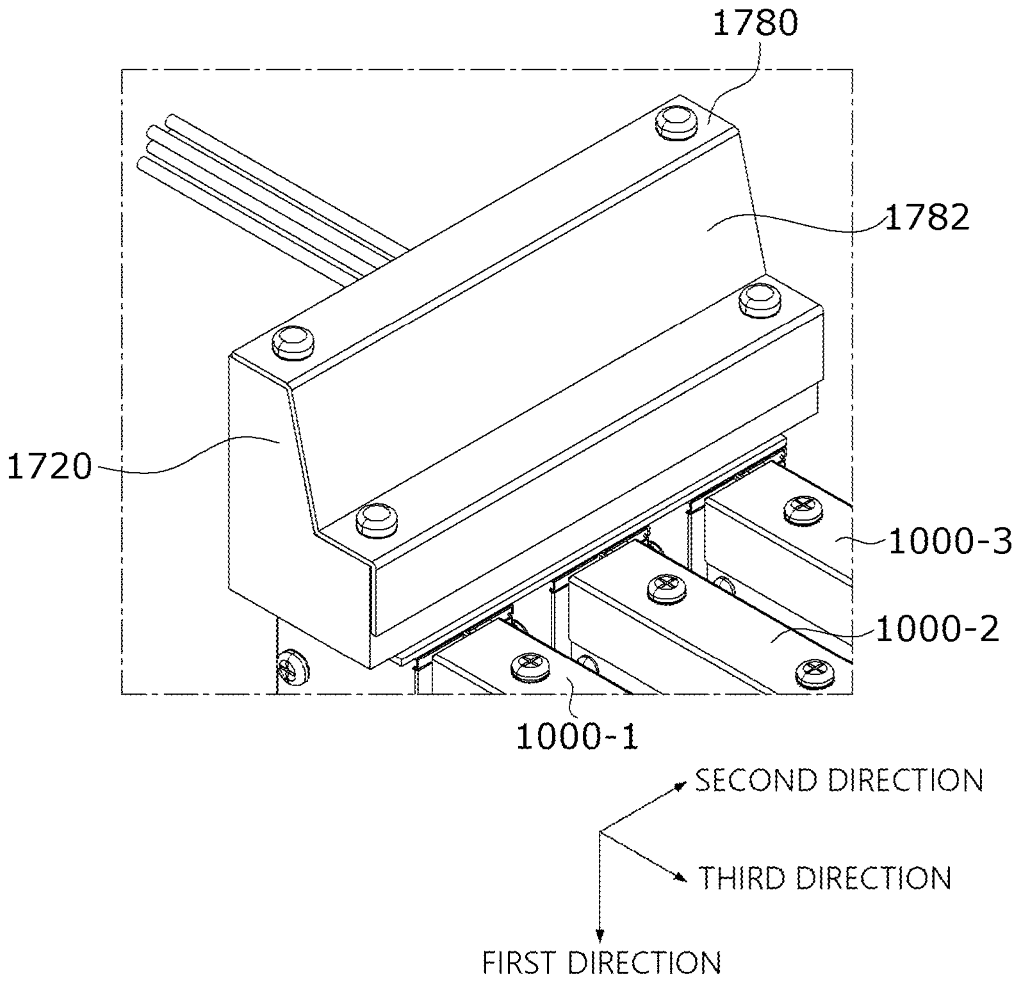
Figure 30:
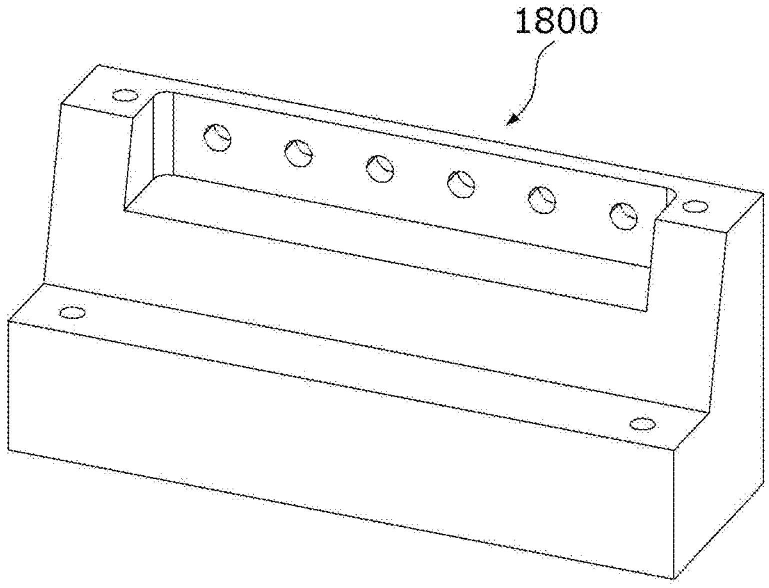
FIG. 30 is a perspective view of an upper structure included in the thermoelectric system according to one embodiment of the present invention.

FIG. 26 shows a thermoelectric system according to one embodiment of the present invention, FIGS. 27 to 29 are views showing a process of assembling a wire protection portion in the thermoelectric system according to one embodiment of the present invention, and FIG. 30 is a perspective view of an upper structure included in the thermoelectric system according to one embodiment of the present invention.

Referring to FIGS. 26 to 29, a thermoelectric system 2500 includes a first thermoelectric device 1000-1, a second thermoelectric device 1000-2 spaced apart from the first thermoelectric device 1000-1 along a first direction, a third thermoelectric device 1000-3 spaced apart from the second thermoelectric device 1000-2 along a first direction, a wire W electrically connected to the first thermoelectric device 1000-1, the second thermoelectric device 1000-2, and the third thermoelectric device 1000-3, and a wire protection portion 1700 disposed on one side of the first thermoelectric device 1000-1, the second thermoelectric device 1000-2, and the third thermoelectric device 1000-3 to surround at least a portion of the wire W.

A first fluid flows through each of the first thermoelectric device 1000-1, the second thermoelectric device 1000-2, and the third thermoelectric device 1000-3 along a second direction perpendicular to the first direction, and a second fluid having a higher temperature than the first fluid may flow between the first thermoelectric device 1000-1, the second thermoelectric device 1000-2, and the third thermoelectric device 1000-3 along a third direction perpendicular to the first and second directions.

Each of the first thermoelectric device 1000-1, the second thermoelectric device 1000-2, and the third thermoelectric device 1000-3 may be the thermoelectric devices described with reference to FIGS. 1 to 25.

As described above, the wire W connected to the thermoelectric module included in each thermoelectric device is drawn out to an upper end of a fluid inflow region 510 of a fluid flow portion 1100, that is, a fourth surface 1140 of the fluid inflow region 510 of the fluid flow portion 1100.

According to the embodiment of the present invention, the wire protection portion 1700 is disposed on one side of a plurality of thermoelectric devices disposed to be spaced apart along the first direction, for example, the first thermoelectric device 1000-1, the second thermoelectric device 1000-2, and the third thermoelectric device 1000-3. Here, one side refers to the fluid inflow region 510 of the fluid flow portion 1100, and the upper portion refers to a surface disposed in a direction in which the second fluid flows, that is, the fourth surface 1140 of the fluid flow portion 1100 when the second fluid flows in the third direction from the fourth surface 1140 of the fluid flow portion 1100 toward the third surface 1130.

The wire protection portion 1700 serves to gather the wires drawn out from a plurality of thermoelectric devices and guide the wires to the outside. Since when the wire protection portion 1700 is disposed on one side of the fluid flow portion 1100, that is, in the fluid inflow region 510, the flow of the second fluid passing through the thermoelectric module 1200 disposed in the flow path region 520 is not hindered, the thermoelectric performance may be enhanced. In addition, since the temperature of the fluid inflow region 510 is lower than the fluid discharge region 520, the temperature of the wire passing through the wire protection portion 1700 may be maintained at a lower level.

Referring to FIGS. 26 and 27, the wire protection portion 1700 includes a bottom portion 1710 disposed on the plurality of thermoelectric devices 1000-1, . . . , 1000-3, a first side wall 1720 extending from a first end 1711 of the bottom portion 1710 toward an upward direction of the bottom portion 1710, a second side wall 1730 extending from a second end 1712 spaced apart from the first end 1711 of the bottom portion 1710 along the first direction toward the upward direction of the bottom portion 1710, a third side wall 1740 disposed between the first side wall 1720 and the second side wall 1730 and extending from a third end 1713 between the first end 1711 and the second end 1712 of the bottom portion 1710 toward the upward direction of the bottom portion 1710, a fourth side wall 1742 disposed between the first side wall 1720 and the second side wall 1730 and extending from a fourth end 1714 spaced apart from the third end 1713 of the bottom portion along the second toward the upward direction of the bottom portion 1710, a first top portion 1780 spaced apart from the bottom portion 1710 and extending from the third side wall 1740 toward the second direction, a second top portion 1790 spaced apart from the bottom portion 1710 and extending from the fourth side wall 1742 in a direction opposite to the second direction, and fifth side walls 1770 and 1772 extending from the second top portion 1790 toward the upward direction of the upper bottom portion 1710 and connected to the first top portion 1780. As shown, each of the first end 1711 and the second end 1712 may extend along the second direction, and the first end 1711 and the second end 1712 may be disposed to be spaced apart from each other along the first direction. Each of the third end 1713 and the fourth end 1714 may extend along the first direction, and the third end 1713 and the fourth end 1714 may be disposed to be spaced apart from each other along the second direction. In this case, a height of the first top portion 1780 based on the bottom portion 1710 may be higher than a height of the second top portion 1790.

According to the embodiment of the present invention, a distance between the third side wall 1740 and the fifth side walls 1771 and 1772 gradually decreases along the upward direction of the bottom portion 1710. For example, when the third side wall 1740 is disposed almost vertically with respect to the bottom portion 1710, the fifth side walls 1770 and 1772 may be inclined so that its part further away from the bottom portion 1710 in the upward direction is closer to the third side wall 1740. For example, the third side wall 1740 and the fifth side walls 1771 and 1772 may be disposed so that an angle between the third side wall 1740 and the fifth side walls 1771 and 1772 in the second direction is 10 to 70 degrees, preferably 15 to 60 degrees, more preferably 20 to 50 degrees, and still more preferably 25 to 40 degrees. Accordingly, as described below, the second fluid may flow between the first to third thermoelectric devices 1000-1, 1000-2, and 1000-3 without any flow path resistance or loss.

In the embodiment of the present invention, the third side wall 1740 and the fourth side wall 1742 may be disposed parallel to each other, and accordingly, a distance between the third side wall 1740 and the fourth side wall 1742 may be the same along the upward direction of the bottom portion 1710.

Alternatively, although not shown, in another embodiment of the present invention, the distance between the third side wall 1740 and the fourth side wall 1742 may gradually decrease along the upward direction of the bottom portion 1710. In this time, the fourth side wall 1742 may be disposed parallel to the fifth side walls 1770 and 1772. That is, an angle between the third side wall 1740 and the fifth side walls 1771 and 1772 in the second direction may be the same as an angle between the third side wall 1740 and the fourth side wall 1742 in the second direction. Alternatively, the angle between the third side wall 1740 and the fifth side walls 1771 and 1772 in the second direction may be smaller than the angle between the third side wall 1740 and the fourth side wall 1742 in the second direction. Accordingly, the second fluid may flow between the first to third thermoelectric devices 1000-1, 1000-2, and 1000-3 without any flow path resistance or loss.

According to the embodiment of the present invention, the wire protection portion 1700 includes a first hole 1750, a second hole 1752, and a third hole 1754 formed to be spaced apart along the first direction in the bottom portion 1710, and a fourth hole 1756 disposed in the third side wall 1740. In this case, the third side wall 1740 may be disposed on a relatively far side from the flow path region 520 among both sides of the bottom portion 1710 spaced apart along the second direction, that is, on the side of the fluid inlet of the first fluid is located, that is, on the side of the third end 1713.

A first wire W1 connected to the first thermoelectric device 1000-1 passes through the first hole 1750, extends upward along the third side wall 1740, and is drawn out through the fourth hole 1756. A second wire W2 connected to the second thermoelectric device 1000-2 passes through the second hole 1752, extends upward along the third side wall 1740, and is drawn out through the fourth hole 1756. A third wire W3 connected to the third thermoelectric device 1000-3 passes through the third hole 1754, extends upward along the third side wall 1740, and is drawn out through the fourth hole 1756.

In this way, when the wire protection portion 1700 gathers the wires connected to the plurality of thermoelectric devices and draws the wires out, the wire connection and work are easy, and it is easy to protect the wires from the high-temperature second fluid.

In this case, the first hole 1750, the second hole 1752, and the third hole 1754 may be formed at a boundary between the bottom portion 1710 and the third side wall 1740 of the wire protection portion 1700. Accordingly, the first to third wires W1, W2, and W3 passing through the first hole 1750, the second hole 1752, and the third hole 1754 may be extended upward along the third side wall 1740 in a state of being in contact with the third side wall 1740 and then drawn out through the fourth hole 1756. Since the third side wall 1740 is disposed on the side of the fluid inlet, when the first to third wires W1, W2, and W3 come into contact with the third side wall 1740, the temperature of the first to third wires W1, W2, and W3 may be maintained at a lower state.

Referring to FIGS. 27 and 28, according to the embodiment of the present invention, the wire protection portion 1700 may further include an insulating member 1760. The insulating member 1760 may be disposed on the bottom portion 1710 between the first side wall 1720 and the second side wall 1730. In this case, the insulating member 1760 may be disposed to be in contact with the first to third wires W1, W2, and W3 extending along the third side wall 1740. Accordingly, even when the high-temperature second fluid passes through the surface of the wire protection portion 1700, the problem of heat being applied to the first to third wires W1, W2, and W3 may be prevented by the insulating member 1760. In this case, the insulating member 1760 may include a first insulating member disposed between the bottom portion 1710 and the first top portion 1780 and a second insulating member disposed between the bottom portion 1710 and the second top portion 1790.

In this case, a space between the first side wall 1720 and the second side wall 1730 and the insulating member 1760 may be sealed by a sealing member 770. Accordingly, the problem of heat of the second fluid being applied to the first to third wires W1, W2, and W3 through the gap between the first side wall 1720 and the second side wall 1730 and the insulating member 1760 may be prevented.

Referring to FIG. 29, the wire protection portion 1700 is disposed between the first side wall 1720 and the second side wall 1730, and further includes a shield cover portion 780 that covers at least a portion of the first top portion 1780, the second top portion 1790, and the fifth side walls 1770 and 1772. To this end, at least one of fastening holes 1782, 1784, 1792, and 1794 is formed in each of the first top portion 1780 and the second top portion 1790, and the wire protection portion 1700 may be fastened to the shield cover portion 780 using a fastening member through at least one fastening hole 1782, 1784, 1792, and 1794.

Referring back to FIG. 26, the thermoelectric system 2500 may further include the wire protection portion 1700 and an upper structure 1800 spaced apart along the second direction and disposed on the other side of the first thermoelectric device 1000-1, the second thermoelectric device 1000-2, and the third thermoelectric device 1000-3. Here, the other side of the first thermoelectric device 1000-1, the second thermoelectric device 1000-2, and the third thermoelectric device 1000-3 may refer to the side of the fluid outlet of the first fluid.

Referring to FIG. 30, the external shape of the upper structure 1800 may be the same as the external shape of the wire protection portion 1700 and may be disposed symmetrically with the wire protection portion 1700. For example, the upper structure 1800 may include an insulating material and may be formed into an external shape symmetrical to the wire protection portion 1700. Alternatively, the upper structure 1800 may have the same material and structure as the wire protection portion 1700. For example, the upper structure 1800 may also include the bottom portion, a first side wall 1820, a second side wall 1830, a third side wall, a fourth side wall 1844, a first top portion 1880, a second top portion 1890, and a fifth side wall 1870 in a shape symmetrical to the wire protection portion 1700. For example, the upper structure 1800 may have the same shape as the shape in which the wire protection portion 1700 is filled with the insulating member 1760. Although not shown, the shield cover portion is disposed on at least a portion of the first top portion 1880, the second top portion 1890, and the fifth side wall 1870 of the upper structure 1800, and the shield cover portion may be fastened to the upper structure 1800 through fastening holes 1882, 1884, 1892, and 1894 formed in the first top portion 1880 and the second top portion 1890. Accordingly, the weights of both sides of the thermoelectric system 2500 may be balanced. The upper structure 1800 may be disposed on the fluid discharge region 520 of the fluid flow portion 1100 of the first thermoelectric device 1000-1, the second thermoelectric device 1000-2, and the third thermoelectric device 1000-3. Accordingly, the wire protection portion 1700 and the upper structure 1800 may also serve to guide the flow of the second fluid.

To this end, the shield cover portion 780 of the wire protection portion 1700 may include a first inclined surface 782, and the upper structure 1800 may include a second inclined surface corresponding to the first inclined surface 782. The first inclined surface 782 may be disposed along the fifth side walls 1770 and 1772 of the wire protection portion 1700. The second inclined surface may refer to the fifth side wall 1870 of the upper structure 1800 or a surface disposed along the fifth side wall 1870 of the shield cover portion of the upper structure 1800.

As shown in FIG. 26, according to the embodiment of the present invention, a distance D between the first inclined surface 782 and the second inclined surface may gradually narrow along a direction in which the second fluid flows. Accordingly, the second fluid flowing into the thermoelectric system 2500 may be collected in a central region where the thermoelectric module 1200 is disposed and then pass along the third direction.

Meanwhile, according to another embodiment of the present invention, the thermoelectric system may be disposed in multiple stages.

Figure 31:
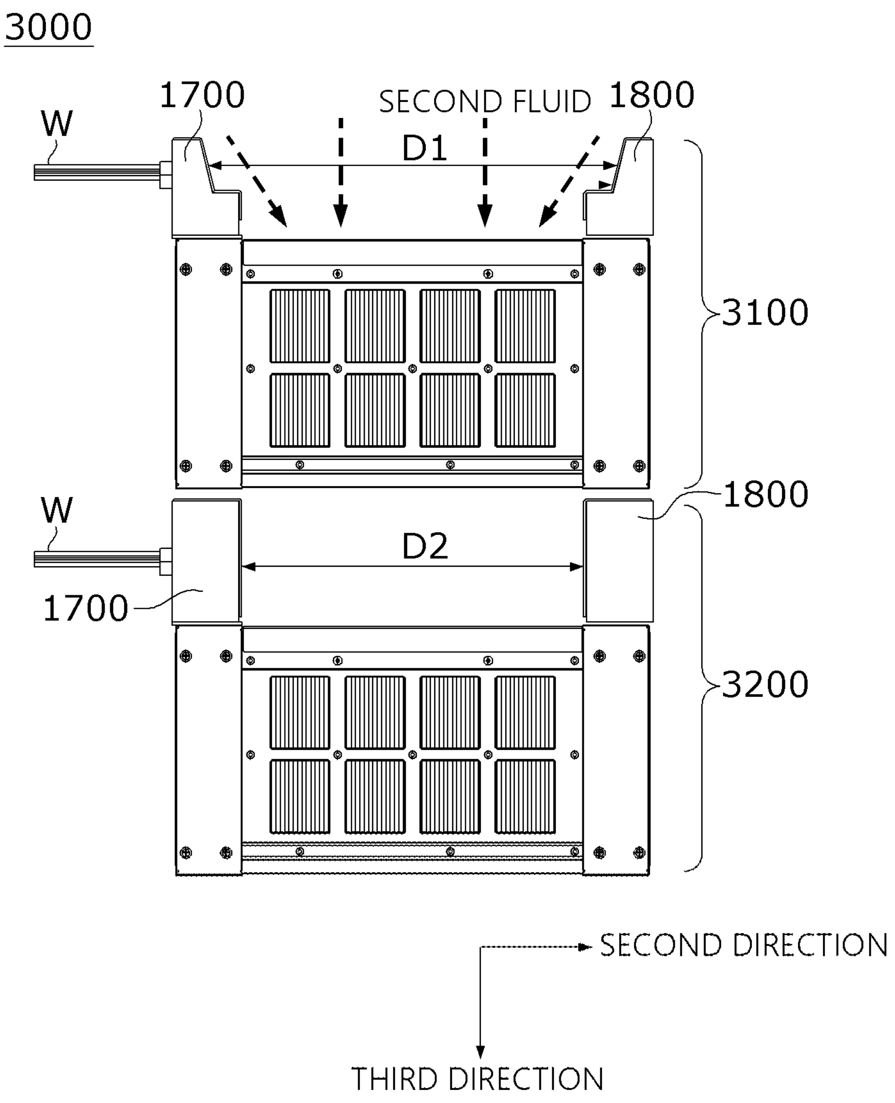
FIG. 31 is a perspective view of a thermoelectric system according to another embodiment of the present invention.
Figure 32:
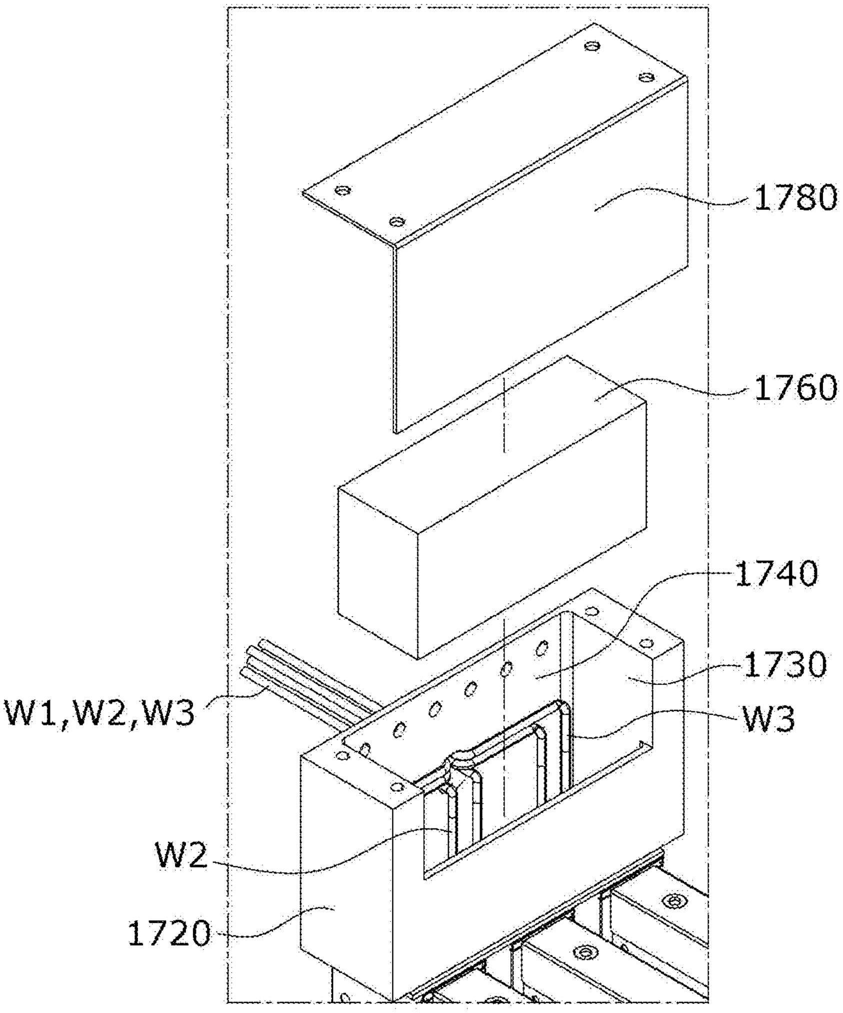
FIGS. 32 and 33 are views showing a process of assembling a wire protection portion in the thermoelectric system according to another embodiment of the present invention.
Figure 33:
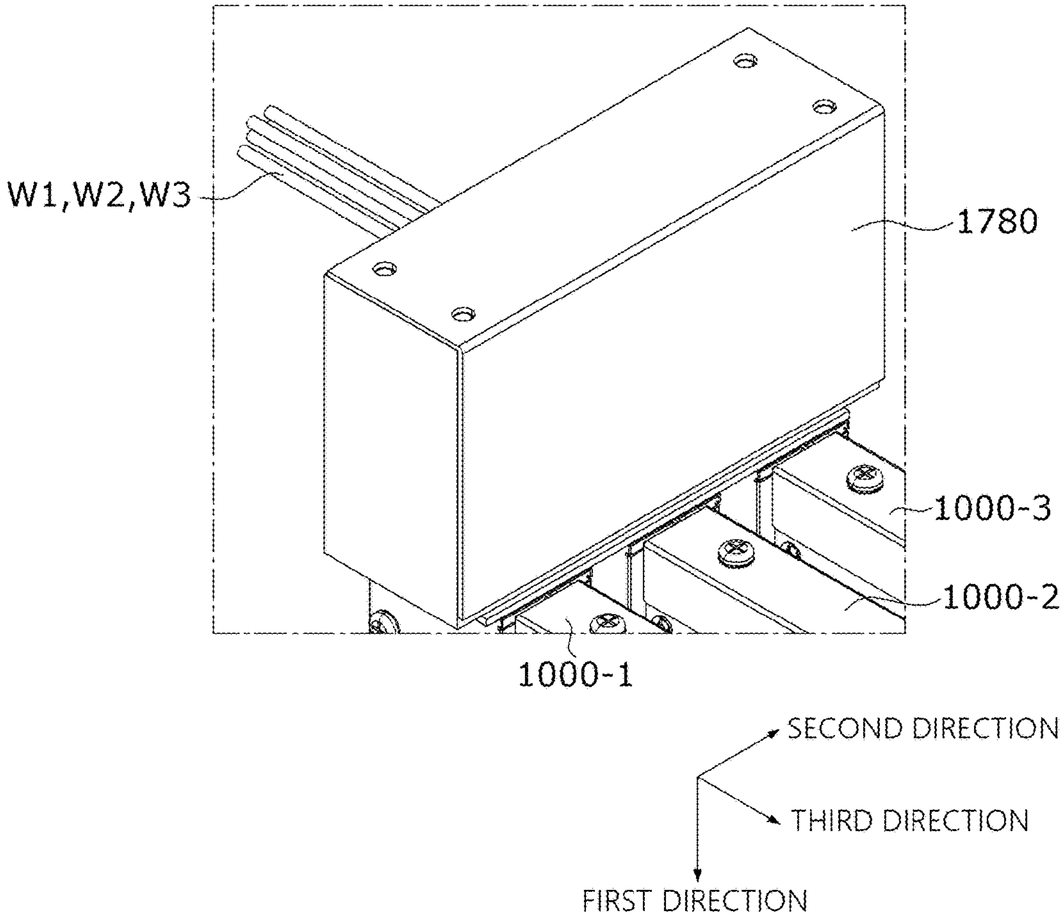
Figure 34:
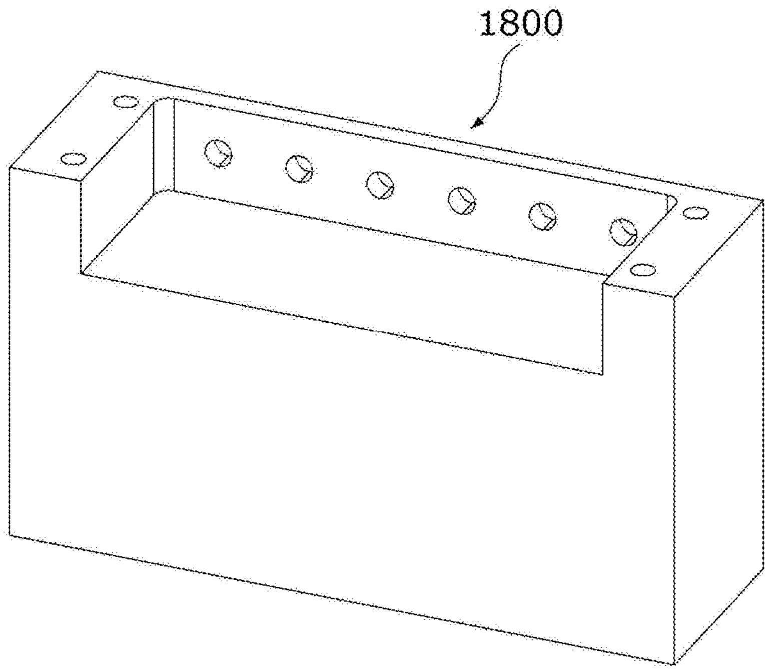
FIG. 34 is a perspective view of an upper structure included in the thermoelectric system according to another embodiment of the present invention.

FIG. 31 is a perspective view of a thermoelectric system according to another embodiment of the present invention, FIGS. 32 and 33 are views showing a process of assembling a wire protection portion in the thermoelectric system according to another embodiment of the present invention, and FIG. 34 is a perspective view of an upper structure included in the thermoelectric system according to another embodiment of the present invention.

Referring to FIGS. 31 to 33, a thermoelectric system 3000 includes a first thermoelectric system 3100 and a second thermoelectric system 3200 disposed below the first thermoelectric system 3100 along a third direction in which a second fluid flows, and each thermoelectric system includes a plurality of thermoelectric devices disposed to be spaced apart in a first direction.

The contents described with reference to FIGS. 1 to 25 may be applied to each of the plurality of thermoelectric devices included in each of the first thermoelectric system 3100 and the second thermoelectric system 3200.

For each of the first thermoelectric system 3100 and the second thermoelectric system 3200, duplicate descriptions of the same contents as those described through FIGS. 26 to 30 are omitted.

According to the embodiment of the present invention, the external shape of the wire protection portion and the upper structure included in the first thermoelectric system 3100 may be different from the external shape of the upper structure of the wire protection portion included in the second thermoelectric system 3200.

In the thermoelectric system closest to the inlet of the second fluid, for example, in the first thermoelectric system 3100 in FIG. 31, a gap D1 between facing surfaces of the wire protection portion 1700 and the upper structure 1800 may gradually narrow along the direction in which the second fluid flows. Accordingly, the second fluid flowing in the thermoelectric system 3000 may be collected in a central region where the thermoelectric module 1200 is disposed and then pass along the third direction.

In contrast, the shape of a wire protection portion 2700 and an upper structure 2800 in the thermoelectric system disposed below the thermoelectric system closest to the inlet of the second fluid, for example, the second thermoelectric system 3200 in FIG. 31, is different from the shape of the wire protection portion 1700 and the upper structure 1800 in the thermoelectric system closest to the inlet of the second fluid, for example, the first thermoelectric system 3100 in FIG. 31.

According to the embodiment of the present invention, a width of a bottom portion of the wire protection portion 2700 of the second thermoelectric system 3200 is 0.98 to 1.02 times a width of a top portion. Similarly, a width of a bottom portion of the upper structure 2800 of the second thermoelectric system 3200 is 0.98 to 1.02 times a width of a top portion. Here, the bottom and top portions may be disposed in opposite directions along the third direction. For example, the bottom portion may be a bottom surface disposed to face a plurality of thermoelectric devices included in the second thermoelectric system 3200 or a region including the bottom surface, and the top portion may be a top surface that is the opposite surface of the bottom surface or a region including the top surface. The top surface may be a surface disposed to face the first thermoelectric system 3100.

Accordingly, facing surfaces of the wire protection portion 2700 and the upper structure 2800 in the thermoelectric system disposed below the thermoelectric system closest to the inlet of the second fluid, for example, the second thermoelectric system 3200 in FIG. 31, may be parallel to each other. In the present specification, when an error range is within ±4%, the surfaces may be interpreted as parallel. That is, in the second thermoelectric system 3200 in FIG. 31, a gap D2 between the facing surfaces of the wire protection portion 2700 and the upper structure 2800 may be the same or have a deviation of ±4% along the direction in which the second fluid flows. For example, the deviation between the shortest distance between the bottom portion of the wire protection portion 2700 and the bottom portion of the upper structure 2800 and the shortest distance between the top portion of the wire protection portion 2700 and the top portion of the upper structure 2800 may be within ±4%. That is, the shortest distance between the bottom portion of the wire protection portion 2700 and the bottom portion of the upper structure 2800 may be 0.96 to 1.04 times the shortest distance between the top portion of the wire protection portion 2700 and the top portion of the upper structure 2800. Accordingly, the problem of the second fluid flowing outside the central region where the thermoelectric module 1200 is disposed to cause a vortex flow may be prevented. That is, the facing surfaces of the wire protection portion 2700 and the upper structure 2800 may serve to control the vortex flow of the second fluid within a path through which the second fluid flows.

To this end, the shape of first and second side walls 2720 and 2730, the shape of an insulating member 2760, and the shape of a shield cover portion 2780 of the wire protection portion 2700 of the second thermoelectric system 3200 may be different from the shape of the first and second side walls 1720 and 1730, the shape of the insulating member 1760, and the shape of the cover member 1780 of the wire protection portion 1700 of the first thermoelectric system 3100. As described through FIGS. 26 to 30, the shield cover portion 2780 includes a first inclined surface, and accordingly, fifth side wall 1770 and 1772 also includes an inclined surface so that the shield cover portion 2780 may be disposed. In contrast, the external shape of the wire protection portion 2700 of the second thermoelectric system 3200 may be a rectangular parallelepiped, and accordingly, the external shape of the upper structure 2800 of the second thermoelectric system 3200 may also have a rectangular parallelepiped shape, which is the same external shape as the wire protection portion 2700.

That is, the wire protection portion 2700 of the second thermoelectric system 3200 includes a bottom portion that is disposed on the thermoelectric device and surrounded by a fifth end 2711, a sixth end 2712, a seventh end, and an eighth end 2714, a sixth side wall 2720 and a seventh side wall 2730 that each extend from the fifth end 2711 and the sixth end 2712 of the bottom portion toward an upward direction of the bottom portion, an eighth side wall 2740 that is disposed between the sixth side wall 2720 and the seventh side wall 2730 and extends from the seventh end of the bottom portion toward the upward direction, a ninth side wall 2742 that is disposed between the sixth side wall 2720 and the seventh side wall 2730 and extends from the eighth end 2714 of the bottom portion toward the upward direction, and a third top portion 2790 that is spaced apart from the bottom portion and extends from the eighth side wall 2740 toward a second direction. In this case, the ninth side wall 2740 extends to the third top portion 2790, and the eighth side wall 2740 and the ninth side wall 2740 are parallel to each other. As shown, both ends of the ninth side wall 2740 along the first direction may extend to meet the third top portion 2790, and accordingly, the ninth side wall 2740 may have a concave shape between the both ends along the first direction. When the ninth side wall 2740 has the concave shape between the both ends along the first direction, the shield cover portion 2780 is easily assembled after disposing wires and insulating members in the space between the bottom portion, the eighth side wall 2740, and the ninth side wall 2740.

Similarly, the upper structure 2800 of the second thermoelectric system 3200 may include side walls 2820 and 2842 and a top portion 2980 symmetrical to the wire protection portion 2700. Although not shown, the shield cover portion of the upper structure 2800 of the second thermoelectric system 3200 may have the same shape as the shield cover portion 2780 of the wire protection portion 2700 of the second thermoelectric system 3200.

Here, the second thermoelectric system 3200 is shown as being disposed under the first thermoelectric system 3100, but is not limited thereto, and an additional thermoelectric system may be disposed under the second thermoelectric system 3200.

Throughout the present specification, the thermoelectric element 100 and 1210 are described as including the first substrate 110, the first electrode portion 120, the P-type thermoelectric leg 130, the N-type thermoelectric leg 140, the second electrode portion 150, and the second substrate 160, but the definition of the thermoelectric elements 100 and 1210 is not limited thereto, and the thermoelectric elements 100 and 1210 may also refer to a thermoelectric element in which the first electrode portion 120, the P-type thermoelectric leg 130, the N-type thermoelectric leg 140, the second electrode portion 150 and the second substrate 160 are included and disposed on the first substrate 110.

The power generation system may generate power using heat sources generated by ships, vehicles, power plants, geothermal heat, and the like, and arrange a plurality of power generation devices to efficiently converge the heat sources. In this case, each power generation device may improve the cooling performance of the low-temperature portion of the thermoelectric element by improving the bonding force between the thermoelectric module and the fluid flow portion, thereby improving the efficiency and reliability of the power generation device, so that the fuel efficiency of transportation devices such as ships, vehicles, and the like, may be improved. Therefore, in the shipping and transportation industries, it is possible to reduce transportation costs and create an eco-friendly industrial environment, and when applied to manufacturing industries such as steel mills and the like, it is possible to reduce material costs and the like.

Although the preferred embodiments of the present invention have been described above, it is understood that those skilled in the art can make various changes and modifications to the present invention without departing from the spirit and scope of the present invention set forth in the claims below.

The invention claimed is:

1. A thermoelectric module array comprising:
a first thermoelectric module;
a second thermoelectric module disposed adjacent to the first thermoelectric module in a first direction; and
a frame,
wherein:
the first thermoelectric module includes:
a first lower substrate;
a plurality of first semiconductor elements disposed on the first lower substrate; and
a first upper substrate disposed on the plurality of first semiconductor elements,
the second thermoelectric module includes:
a second lower substrate;
a plurality of second semiconductor elements disposed on the second lower substrate; and
a second upper substrate disposed on the plurality of second semiconductor elements,
the first lower substrate includes a first groove having a semi-circular shape and formed on an outer surface of the first lower substrate,
the second lower substrate includes a second groove having a semi-circular shape and formed on an outer surface of the second lower substrate facing the outer surface of the first lower substrate in the first direction,
the first groove and the second groove are disposed at positions corresponding to each other to form a first hole,
the frame is disposed on the first lower substrate and the second lower substrate and disposed between the first upper substrate and the second upper substrate,
the frame includes a first opening through which the first upper substrate passes, a second opening through which the second upper substrate passes, and a second hole vertically overlapping the first hole, and
one fastening member passes through the first hole and the second hole to simultaneously secure the first thermoelectric module and the second thermoelectric module.

2. The thermoelectric module array of claim 1, wherein the plurality of first semiconductor elements disposed on the first lower substrate include 1-1 semiconductor elements disposed in a first region of the first lower substrate and 1-2 semiconductor elements disposed in a second region of the first lower substrate, the plurality of second semiconductor elements disposed on the second lower substrate include 2-1 semiconductor elements disposed in a third region of the second lower substrate and 2-2 semiconductor elements disposed in a fourth region of the second lower substrate, the first upper substrate includes a 1-1 upper substrate disposed on the 1-1 semiconductor elements and a 1-2 upper substrate disposed on the 1-2 semiconductor elements, and the second upper substrate includes a 2-1 upper substrate disposed on the 2-1 semiconductor elements and a 2-2 upper substrate disposed on the 2-2 semiconductor elements.

3. The thermoelectric module array of claim 2, wherein the first groove and the second groove are disposed at a position corresponding to a region between the 1-1 upper substrate and the 1-2 upper substrate.

4. The thermoelectric module array of claim 3, wherein the frame is disposed between the 1-1 upper substrate and the 1-2 upper substrate and between the 2-1 upper substrate and the 2-2 upper substrate.

5. The thermoelectric module array of claim 2, further comprising a connecting electrode connecting the first region and the second region, wherein the first groove and the second groove are disposed at a position where the first groove and the second groove overlap each other along a direction perpendicular to a direction in which the connecting electrode extends.

6. The thermoelectric module array of claim 3, wherein the first upper substrate includes a first cut portion, the second upper substrate includes a second cut portion, and the first cut portion and the second cut portion are corner portions of the first upper substrate and the second upper substrate adjacent to the fastening member.

7. The thermoelectric module array of claim 6, wherein the frame has a shape corresponding to the first cut portion and the second cut portion.

8. The thermoelectric module array of claim 1, comprising:

a first insulating layer disposed between the first lower substrate and the plurality of first semiconductor elements; and a second insulating layer disposed between the plurality of first semiconductor elements and the first upper substrate.

9. The thermoelectric module array of claim 8, further comprising a third insulating layer disposed between the first insulating layer and the plurality of first semiconductor elements.

10. The thermoelectric module array of claim 1, wherein the first thermoelectric module further includes a first electrode part disposed on the first lower substrate, an extension electrode extending to one side from the first electrode part on the first lower substrate, and an insulating member disposed on the extension electrode.

11. The thermoelectric module array of claim 10, wherein a ratio of a distance from an end of the first lower substrate to a closest semiconductor element among the plurality of first semiconductor elements to a distance from the extension electrode to the end of the first lower substrate is 1.5 or more and 3.5 or less.

12. The thermoelectric module array of claim 11, wherein a ratio of a height of the insulating member to the distance from the extension electrode to the end of the first lower substrate is 0.25 or more and 0.7 or less.

13. The thermoelectric module array of claim 10, wherein the insulating member includes a resin portion and an insulating frame having an opening formed to accommodate the resin portion.

14. The thermoelectric module array of claim 13, wherein the opening is disposed at a position corresponding to the extension electrode, and wherein the resin portion is disposed on the extension electrode.

* * * * *